(12) United States Patent
Kukino et al.

(10) Patent No.: US 7,771,847 B2
(45) Date of Patent: Aug. 10, 2010

(54) CBN SINTERED BODY FOR HIGH SURFACE INTEGRITY MACHINING, CBN SINTERED BODY CUTTING TOOL, AND CUTTING METHOD USING THE SAME

(75) Inventors: Satoru Kukino, Itami (JP); Yoshihiro Kuroda, Itami (JP); Tomohiro Fukaya, Itami (JP); Katsumi Okamura, Itami (JP)

(73) Assignee: Sumitomo Electric Hardmetal Corp., Hyogo (JP)

( * ) Notice: Subject to any disclaimer, the term of this patent is extended or adjusted under 35 U.S.C. 154(b) by 702 days.

(21) Appl. No.: 11/630,263

(22) PCT Filed: May 30, 2006

(86) PCT No.: PCT/JP2006/310757
§ 371 (c)(1),
(2), (4) Date: Dec. 20, 2006

(87) PCT Pub. No.: WO2007/057995
PCT Pub. Date: May 24, 2007

(65) Prior Publication Data
US 2008/0286558 A1 Nov. 20, 2008

(30) Foreign Application Priority Data
Nov. 18, 2005 (JP) ............... 2005-333806

(51) Int. Cl.
B32B 9/00 (2006.01)
B23P 15/28 (2006.01)
B24D 3/14 (2006.01)

(52) U.S. Cl. .............. 428/698; 428/699; 428/469; 428/472; 428/704; 407/119; 51/307; 51/309

(58) Field of Classification Search ............. 428/698, 428/699, 216, 336, 325, 469, 472, 704; 501/96.1, 501/96.4; 407/107, 113–119; 51/295, 307, 51/309
See application file for complete search history.

(56) References Cited

U.S. PATENT DOCUMENTS 4,389,223 A * 6/1983 Corrigan .................... 51/307

(Continued)

FOREIGN PATENT DOCUMENTS

JP 52-43486 10/1977

(Continued)

OTHER PUBLICATIONS

Machine translation of JP 2002-003284, Kobata, Jan. 2002.*
Machine translation of JP 09-059068, Ueda, Mar. 1997.*

(Continued)

*Primary Examiner*—Timothy M Speer
(74) *Attorney, Agent, or Firm*—McDermott Will & Emery LLP

(57) ABSTRACT

To provide a high cBN content ratio sintered body that improves fatigue life of the machined part and has a longer tool lifespan than conventional cBN sintered body tools by suppressing the production of the affected layer by machining formed on the machined surface of the workpiece to be cut and by promoting residual compression stress. That is a cBN sintered body according to the present invention is a cBN sintered body for high surface integrity machining having a cBN component of not less than 87% and not more than 99% by volume % and a thermal conductivity of 100 W/m·K or more; and the outermost surface of the cBN sintered body 1 is coated with a heat resistant film 2 having a thickness of 0.5 μm to 12 μm comprising a compound of at least one element selected from 4a, 5a, 6a group elements and Al, and at least one element selected from C, N, and O.

10 Claims, 3 Drawing Sheets

U.S. PATENT DOCUMENTS

| | | |
|---|---|---|
| 5,853,873 A | 12/1998 | Kukino et al. |
| 5,890,847 A * | 4/1999 | Uesaka et al. ............... 407/119 |
| 6,071,841 A | 6/2000 | Sumiya |
| 6,155,755 A | 12/2000 | Kanada et al. |
| 6,737,178 B2 * | 5/2004 | Ota et al. .................... 428/698 |
| 7,524,785 B2 * | 4/2009 | Matsukawa et al. ........ 501/96.4 |
| 2003/0072937 A1 * | 4/2003 | Uesaka et al. ............... 428/336 |
| 2005/0143252 A1 | 6/2005 | Okamura et al. |

FOREIGN PATENT DOCUMENTS

| | | |
|---|---|---|
| JP | 53-77811 | 7/1978 |
| JP | 55-150941 A * | 11/1980 |
| JP | 8-119774 A | 5/1996 |
| JP | 9-59068 A | 3/1997 |
| JP | 9-108911 A | 4/1997 |
| JP | 10-158065 A | 6/1998 |
| JP | 11-320218 A | 11/1999 |
| JP | 2002-3284 A | 1/2002 |
| JP | 2002-235142 A | 8/2002 |
| JP | 2002-263940 A | 9/2002 |
| JP | 2005-97098 A | 4/2005 |
| JP | 2005-187260 A | 7/2005 |
| WO | WO 2005066381 A1 * | 7/2005 |

OTHER PUBLICATIONS

Translation of JP 55-150941, Murai, Nov. 1980.*

International Preliminary Report on Patentability and Written Opinion of the International Searching Authority, issued in corresponding International Patent Application No. PCT/JP2006/310757, mailed May 29, 2008.

* cited by examiner (a)

(b)

CBN SINTERED BODY FOR HIGH SURFACE INTEGRITY MACHINING, CBN SINTERED BODY CUTTING TOOL, AND CUTTING METHOD USING THE SAME

RELATED APPLICATIONS

This application is the U.S. National Phase under 35 U.S.C. §371 of International Application No. PCT/JP2006/310757 filed on May 30, 2006, which in turn claims the benefit of Japanese Application No. 2005-333806, filed on Nov. 18, 2005, the disclosures of which Applications are incorporated by reference herein.

TECHNICAL FIELD

The present invention relates to a cBN sintered body for high surface integrity machining in the cutting of ferrous materials such as hardened steel, FCD cast iron and ADI cast iron that are extremely hard and hard-to-cut materials, and by controlling the cutting edge temperature during cutting, the production of an affected layer by the cutting tool on the cut surface is suppressed, residual compression stress is promoted, the fatigue life of cutting tools is improved, and the lifespan of cutting tools is elongated.

BACKGROUND ART

For example, compared to conventional materials for cutting tools such as carbide tools, etc., cBN based sintered body cutting tools have material characteristics of high performance that can be highly efficient and long-lasting because of the chemical stability and the extreme hardness of cBN sintered body. In addition, cBN sintered body cutting tools are highly valued for their superior flexibility and high environmental-friendly productivity compared to grinding tools as processing tools to deform such as cutting tools, and they have substituted for conventional tools in the machining of hard-to-cut ferrous materials.

cBN sintered body materials can be classified into two types: one type is a sintered body comprising cBN particles and binder materials, in which the cBN content ratio is high, the cBN particles bond each other, and the main components of the remainder are Co and Al as described in Patent Document 1, or is a sintered body that does not comprise any component other than cBN as much as possible, like Patent Document 2 (called "high cBN content ratio sintered body" hereinafter). The other type has a comparatively low cBN content ratio, has a low contact ratio between cBN elements, and is bonded through a ceramic comprising Ti nitrides (TiN) and carbides (TiC) that show a low affinity with iron, as disclosed in Patent Document 3 (called "low cBN content ratio sintered body" hereinafter).

In uses in which chips are split off and are not likely to generate shear heat, the former type, high cBN content ratio sintered body achieves outstanding stability and long lifetime because of the superior mechanical characteristics (extreme hardness, high strength, high toughness) and high thermal conductivity of the cBN; and it is suitable for cutting of ferrous sintered parts and gray cast iron in which mechanical wear and damage caused by rubbing against hardened particles and damage caused by thermal impact based on high speed interrupted cutting predominate.

Nonetheless, in machining of steel and hardened steel in which the cutting edge is exposed to a high temperature by large quantity of shear heat produced by continuous cutting, the lifespan is shorter than that of conventional carbide tools and ceramic tools because wear is rapidly advanced by the thermal wear of the cBN component with the iron.

Meanwhile, the latter, low cBN content ratio sintered body manifests superior wear resistance characteristics based on the workings of binder comprising TiN or TiC ceramic, which has a low affinity with iron at high temperatures, and in particular, in hardened steel machining which cannot be machined practically with conventional carbide tools and ceramic tools, low cBN content ratio sintered body has positively substituted in grinding as a cutting tool that can achieve a tool life ten to several dozen times that of conventional tools.

In recent years, by increasing rigidity of machine tools, adjusting the percentages of cBN and the Ti-based binder in low cBN content ratio sintered bodies, cBN sintered body tools are applied instead of grinding tools to machining applications in which the required precision is 3.2 μm to 6.3 μm in ten point averaged roughness (abbreviated "Rz" hereinafter), for example, as in cutting of automotive transmission parts and engine parts comprising hard-to-cut ferrous materials such as hardened steel, represented by SCM420, SCR420, S50C, and SUJ2, which are steels with a surface hardness heightened to Hv 4.5 GPa to 8.0 GPa (HRc45 to HRc64) by the so-called carburized hardening process, FCD (ductile) cast iron such as FCD600 with a hardness heightened to HB200 or more, and ADI (austempered) cast iron such as ADI1000.

Recently, in sliding surfaces and rotating surface, etc. that require a high precision surface roughness of Rz 0.4 μm to 3.2 μm, studies have begun on the application of cutting tools comprising low cBN content ratio sintered body instead of grinding, which has restrictions in terms of machining efficiency and flexibility, in uses for the final finishing step requiring high grade surfaces having sufficient fatigue strength in the machined region, or for semi-finish machining to obtain a high grade surface using only finish processing with an ultra-fine machining allowance of 5 to 10 μm or less, such as honing machine honing, which needs a smaller machining allowance than the conventional grinding process.

However, when cutting hardened steel with a machining efficiency of cutting speed V=100 m/min, depth of cut d=0.15 mm, and feed rate f=0.08 mm/rev. (chip removal volume W per unit time is 1,200 mm$^3$/min) or more, which are judged to be beneficial to industrially apply cBN sintered body cutting tools to machining of hardened steel or high strength cast iron such as FCD and ADI, an affected layer by machining of a thickness of 1 to 20 μm may be formed on the surface of the machined part. The permissible range for the amount of this affected layer by machining produced is stipulated according to the required fatigue life characteristics, which depend on the various stress environments expected to be applied when the machined part is made to a final product.

Specifically, in cutting of universal joint or race bearing surfaces, which are roller and ball rotational track surfaces, if the thickness of aforementioned affected layer by machining is up to about several μm, this affected layer by machining may act as an extreme hardness protection film greater than the hardness by hardening process. If the thickness of affected layer by machining on the race surface of a bearing for uses applied high stress exceeds 10 μm, there is concern that the damage such as wear, flaking and peeling of the mating surface will be accelerated and the fatigue life will decrease, and therefore, in industry, machine processing is used in another process of time-consuming grinding to remove a machining allowance of several dozen μm.

It is known that when cutting after hardening the production of affected layer by machining increases the more that processing is conducted under high efficiency conditions.

Nonetheless, the conditions producing the affected layer by machining and the characteristics of the affected layer by machining itself were not clear in detail.

Thus, for the hardened steel cutting evaluating a variety of cutting conditions using commercial cBN sintered body tools and then researching and analyzing the production of affected layers by machining revealed that the affected layer by machining in hardened steel cutting is composed of martensite as the main component, a mixed phase of residual austenite, bainite, iron oxide and an extremely small amount of iron nitride, etc. The affected layer by machining has a high hardness of about Hv9 GPa to 10 GPa, and is prone to have a tensile stress different from the residual stress of the hardened steel surface, on which the compression stress is supposed to remain principally, and ultimately in almost all cases the tensile stress remains on the machined surface if the affected layer by machining exceeds 10 μm.

The amount of the aforementioned affected layer by machining produced is serious when machining under high efficiency conditions or when an amount of cutting tool flank wear develops, and therefore, martensite produced on the machined part surface by hardening process changes phase to austenite by the heating during cutting caused by the continuous chip friction heat and the shearing heat, which is particular for hardened steel, as well as by heat during cutting due to the frictional heat between the machined surface of the machined part and the tool flank. And, a mixed phase having a main body of martensite including oxide phase and nitride phase is formed after cutting by rapid cooling in air including oxygen, nitrogen and water vapor. Consequently, when the cutting edge passes over the surface machined, the surface is exposed to high temperatures of at least 727° C. or more, which is the austenite transformation temperature of eutectoid steel, and therefore, a mechanism that selective plastic deformation arises on the outermost surface of the machined object by the thermal stress and the compression residual stress of the machined surface is offset works. The hypothesis here obtained is that if the machining surface is exposed to high temperatures at which the thickness of the affected layer by machining exceeds 5 μm, a tensile stress remains on the machined surface based on the mechanism and this tensile stress may lower the fatigue strength depending on the use of the machined parts.

Further, to clarify the characteristics required on the tool side to solve the problem, cutting was carried out by use of TiC—$Al_2O_3$ ceramic and cBN sintered body tools to cut SUJ2 test pieces hardened to a hardness of Hv 7 GPa, in order to evaluate differences in the thickness and form of affected layer by machining with the same cutting edge form, and the same cutting conditions at the time that the width of flank wear was the same. Irrespective of the time at which the width of flank wear was the same, an affected layer by machining was less likely to be produced in cBN sintered body tools than in ceramic tools, and it was revealed that, even if produced, the thickness of the affected layer by machining was ⅔ or less that of the ceramic tools. However, even when using cBN sintered body tools, if the thickness of affected layer by machining exceeds 10 μm, the residual stress was transformed from compression to tension in nearly all cases.

Derived from the aforementioned hypothesis regarding the mechanism of the production of residual stress, it is supposed that the cBN sintered body tool exhibiting a lower cutting edge temperature at the time of cutting influences. In order to further clarify this, the temperature of the cutting edge during cutting was measured using a two-color pyrometer, which can measure the temperature of micro-regions without being affected by the material of the tool or the condition of the tool surface, in the initial stage of cutting with no difference in the width of flank wear. The results unveiled that the cutting temperature in the cBN sintered body tool was 50% to 80% that in the ceramic tool, and the aforementioned hypothesis regarding the affected layer by machining generation mechanism in hardened steel cutting using a cBN sintered body tool was supported by the results obtained.

According to the results of the aforementioned research, in hardened steel cutting, it is necessary to lower the cutting edge temperature of the tool in order to improve the fatigue life of the machined parts, and as the simplest means of solution, it is effective to control the amount of heat generated during cutting by lowering the machining efficiency. However, when conducting a variety of studies with commercial cBN sintered body tools using ceramic binder materials comprising TiN or TiC for cutting hardened steel, irrespective of whether or not coolant is used, if machining efficiency is of a cutting speed V=70 m/min, depth of cut d=0.15 mm, and feed rate f=0.07 mm/rev. (chip removal volume W per unit time is 735 $mm^3$/min) or more, even at the time of VB=0.1 mm, which is half of VB=0.2 mm, by the further temperature increase caused by the heat of friction when the cutting edge scrapes on the machined part, the value of the amount of flank wear VB generally determined to be the lifespan from the perspective of dimensional precision when cutting hardened steel, an affected layer by machining with a thickness of 10 μm is generated, the residual stress is tensile stress, and high efficiency machining, which is one of the great advantages of hardened steel cutting using cBN sintered body tools, becomes impossible.

Thus, it is necessary to develop a means to prevent residual tensile stress while keeping machining efficiency of a chip removal volume W per unit time of 1,200 $mm^3$/min or more of one cBN sintered body insert, which is the general machining efficiency in hardened steel cutting using cBN sintered body tools.

Patent Document 1: Japanese Patent Publication No. S52-43486

Patent Document 2: Japanese Patent Publication No. H10-158065

Patent Document 3: Japanese Patent Publication No. S53-77811

Patent Document 4: Japanese Patent Publication No. H08-119774

DISCLOSURE OF THE INVENTION

In high efficiency cutting of high-hardness, hard-to-cut ferrous materials such as hardened steel, FCD cast iron, and ADI cast iron, an object is to provide a high cBN content ratio sintered body for high surface integrity machined, and it is characterized in that compared to conventional cBN sintered body tools, the fatigue life of the machined part is improved and the lifetime of the tool can elongate by suppressing the production of an affected layer by machining formed on the machined surface of the workpiece to be cut and by promoting residual compression stress.

As a method to lower the tool cutting edge temperature without lowering the machining efficiency, means i) by effectively releasing the heat generated during cutting due to chip shearing and friction from the cutting edge region to another region, or ii) by taking measures to suppress the actual heat produced during cutting were variously studied.

Focusing on differences in cutting edge temperatures under the same cutting conditions between the aforementioned TiC—Al$_2$O$_3$ ceramic tools and cBN sintered body tools, the results of various analyses confirmed that, with cBN sintered body tools, the thermal conductivity of the tool was improved and B$_2$O$_3$ phase superior in lubrication characteristics was formed on the cutting edge surface region by reacting B atoms in the cBN with oxygen under high temperatures during cutting. The obtained results indicate that the heat produced at the tool cutting edge is reduced by decreasing the frictional heat of the chips and the machined part.

First, rather than a conventional cBN sintered body tool, a cBN sintered body composed of a specialized composition superior in thermal conductivity and lubrication characteristics, and a cBN sintered body tool having a structure to effectively release heat generated in the cutting portion to the interior of the tool (insert) were invented.

Specifically, the following constitution is adopted in the present invention.

(1) A cBN sintered body for high surface integrity machining, having a cBN component of not less than 87% and not more than 99% by volume %, having a thermal conductivity of 100 W/m·K or more, and an outermost surface of the cBN sintered body being coated with a heat resistant film having a thickness of 0.5 µm to 12 µm and comprising a compound of at least one element selected from 4a, 5a, 6a group elements and Al, and at least one element selected from C, N and O.

(2) A cBN sintered body for high surface integrity machining according to (1) above, wherein said cBN sintered body has a B to N mole ratio of not less than 1.10 and not more than 1.17 in the cBN component constituting said cBN sintered body, and, further includes carbon and at least one selected from a Co compound, an Al compound, a W compound or an oxygen compound as a binder material.

(3) A cBN sintered body for high surface integrity machining according to (1) or (2) above, wherein an average particle diameter of the cBN particles constituting said cBN sintered body is not less than 1.0 µm and not more than 6.0 µm; the cBN component contains carbon, oxygen and at least one element selected from Li, Si, Al, Ca and Mg; a sum of said Li, Si, Al, Ca, Mg and carbon is not less than 0.02% and not more than 0.20% by wt % with respect to said cBN component; the cBN component comprises a highly pure cBN component with an amount of oxygen with respect to the cBN component of not more than 0.17% by wt %; and the cBN sintered body has a thermal conductivity of not less than 130 W/m·K.

(4) A cBN sintered body for high surface integrity machining according to any of claims 1 to 3 above, wherein said heat resistant film has a thermal conductivity of not less than 30 W/m·K and not more than 45 W/m·K.

(5) A cBN sintered body cutting tool, wherein the cBN sintered body according to any one of (1) to (4) above is brazed to a substrate comprising a carbide, a cermet, a ceramic or a ferrous material either directly or through a metal backing comprising a carbide sintered integrally with the cBN sintered body; and said metal backing and the brazing material part have a thermal conductivity of not less than 80 W/m·K.

(6) A cBN sintered body cutting tool according to (5) above, wherein said brazing material part comprises at least one selected from Ti and Zr and at least one selected from Ag, Cu, Au and Ni, and has a thermal conductivity of not less than 220 W/m·K; a thickness of said brazing material part is not less than 0.02 mm and not more than 0.20 mm; and no vacancies having a major diameter exceeding 0.5 mm are contained in the brazing material part.

(7) A cBN sintered body cutting tool according to (5) or (6), wherein said brazing material part contains 5% to 40% by volume of cBN particles or diamond particles with an average particle diameter of not less than 5 and not more than 150 µm; and the brazing material part has a thermal conductivity of not less than 280 W/m·K.

(8) A cBN sintered body cutting tool according to any of (5) to (7) above, wherein, said heat resistant film of a region having an area of not less than 10% and not more than 80% with respect to a cutting cross-sectional area Q defined by $$Q=\{R^2 \cdot \tan^{-1}[f/\mathrm{sqr}(4R^2-f^2)]+0.25 f \cdot \mathrm{sqr}(4R^2-f^2)+f(d-R)\}/(\cos \alpha s \cdot \cos \alpha b),$$

with assuming nose R, depth of cut d, feed rate f, side rake angle αb, and inclination angle αs, is removed in a portion of said cBN sintered body cutting tool participating in cutting, and the cBN sintered body directly contacts a workpiece to be cut during cutting.

(9) A cBN sintered body cutting tool according to (8), wherein the heat resistant film of the region having the area of not less than 10% and not more than 80% with respect to said cutting cross-sectional area Q defined in (8) above is removed from a tool flank of said cBN sintered body cutting tool in the region participating in cutting, and the cBN sintered body directly contacts a workpiece to be cut during cutting.

(10) A cutting method for processing a workpiece to be cut to have high surface integrity, wherein the cBN sintered body cutting tool according to any of (5) to (9) above is used to continuously cut a hardened steel of HRc 45 or more while spraying a water soluble cutting fluid at 300 cc/min or more over a cutting edge under conditions of a cutting speed V of not less than 40 m/min and not more than 70 m/min, a depth of cut of not less than 0.05 mm and not more than 0.30 mm, and an amount of feed rate f of not less than 0.16 mm/rev. and not more than 0.20 mm/rev.

(11) A cutting method for processing a workpiece to be cut to have high surface integrity, wherein the cBN sintered body cutting tool according to any of (5) to (9) above is used to continuously cut a hardened steel of HRc 45 or more while spraying an oil mist at not less than 1 cc/hour and less than 300 cc/hour over a cutting edge under conditions of a cutting speed V of not less than 40 m/min and not more than 70 m/min, a depth of cut of not less than 0.05 mm and not more than 0.30 mm, and an amount of feed rate f of not less than 0.16 mm/rev. and not more than 0.20 mm/rev.

As a specific measure of aforementioned i), in order to first improve the thermal conductivity of the cBN sintered body itself, rather than TiN, TiC, which have thermal conductivity of several tens W/m·K at the highest level, and binders such as W compounds, Co compounds and Al compounds, the content percentage of cBN powder, which has thermal conductivity of 1,000 W/m·K or more next to diamond, is increased, and also for the remaining binder materials, the heat resistance thereof is reduced as much as possible in the present invention, and this was applied to cBN sintered body.

In order to promote prevention of high temperature due to retaining cutting heat in the cutting edge by high thermal conductive characteristics of the aforementioned cBN sintered body, and a decrease in cutting edge temperature during cutting can be more reliably achieved by arranging materials having thermal conductivity of not less than 80 W/m·K and not less than 220 W/m·K respectively for the carbides and brazing materials constituting the periphery of the cBN sintered body.

Further, as a specific measure relating to the aforementioned ii), it is also desirable to increase the content percentage of the cBN component that is the source of supply for the $B_2O_3$ phase having the aforementioned lubricating function and to apply cBN particle having a composition such that the mole ratio of B to the N in the cBN component constituting the cBN sintered body is not less than 1.10 and not more than 1.17 to the cBN sintered body of the present invention by reviewing the stoichiometry of the cBN source material powder without adding, for example, $TiB_2$, $Co_2B$ or CoWB compound richer in reactivity with iron, which lowers the wear resistance and defect resistance of the sintered body in order to homogenously produce a suitable amount of $B_2O_3$ phase.

As a method to modify the stoichiometry of the cBN particles to the range of the present invention, cBN particles with a composition such that the mole ratio of B to N in the cBN component constituting the cBN sintered body is not less than 1.10 and not more than 1.17 can be obtained by enclosing the mixture of the binder powder and the cBN particles inside the sintering capsule in a Ti capsule, by placing the source material powder in a vacuum atmosphere, and by heating to a temperature of 1,100 to 1,400° C. at 3.5 to 4.0 GPa, which is a pressure and temperature region for stable cBN, and is a pressure at which gaps are not squashed and the nitrogen between the cBN particles and the binder is easily removed.

In uses for cutting of hardened steel which needs a requisite precision of Rz 0.4 μm to 3.2 μm, the surface roughness of the machined surface is worsened by: a) the stage difference of the highs and lows of the feed marks that are transferred to the surface of the machined object because of striated wear produced on the tool flank; and b) the development of waveness due to an increase of the width of tool flank wear.

The development of striated wear in a) agrees with the rotation direction of the hardened steel and the cutting edge flank, then it is understood that the wear develops mechanically while high stress is applied to the cBN particles and binder materials when scraping, and this high stress causes particle dropout and fracture.

Actually, in conventional technology, in order to decrease the stage difference of the highs and lows of the feed marks of the aforementioned a), the aforementioned worsening of the surface roughness is suppressed every so often by machining while increasing the amount of heat produced at the cutting edge and softening the machined object and chips under high speed conditions of V=150 m/min or more. It is common knowledge for skilled persons in the field that to address the disadvantage that flank wear induced by thermal factors in this case is easily produced by the heat generated under higher speed conditions, the cBN content ratio is set at not less than 40% and not more than 60% by volume, and cBN sintered body material which is strong against thermal wear because of the large percentage of binder materials comprising TiN and TiC ceramics with lower affinity to iron than cBN at high temperatures and which has thermal conductivity characteristic of at highest 50 W/m·K is used. Accordingly, in principle, in the method of improving the surface roughness by promoting the high speed conditions, it was difficult to prevent residual tensile stress by suppressing heat production at the tool cutting edge part, and this is the problem for the present invention.

Meanwhile, the conventional cBN sintered body described in Patent Document 1, which has a cBN component of not less than 65% and not more than 99% by volume and has a Co compound and Al compound as a binder material, exhibits a thermal conductivity of 70 to 90 W/m·K. But, when cutting a hardened steel using a cBN sintered body tool with this cBN sintered body brazed on a metal mount made of carbide even under low speed conditions of not more than V=70 m/min, although there were no defects in the initial cutting period several minutes after beginning cutting, cutting was not possible because of the development of flank wear of several hundred μm. cBN sintered body tools with this conventional cBN sintered body coated with a TiAlN film as disclosed in Patent Document 4 can somewhat suppress flank wear, but, offset by worsening thermal characteristic based on the function of the TiAlN film to insulate heat, the thickness of affected layer by machining produced was not improved.

Thus, even with a cBN sintered body having a cBN component not less than 87% and not more than 99% in volume, in which thermal wear of the cBN sintered body was unavoidable in conventional constitutions because of the increase in cutting edge temperature, by supporting a cBN sintered body having high thermal conductivity and high lubricating properties on a highly conductive substrate as previously described the temperature increase can be lowered in the present invention. And, even under a lower speed condition in which conventional cBN tools can not achieved good surface precision, even in hardened steel cutting uses that needs a requisite precision of Rz 0.4 μm to 3.2 μm with a processing efficiency of a chip removal volume W per unit time of 1,200 $mm^3$/min or more, by taking advantage of the high strength characteristics based on a high cBN content ratio, a lifespan equivalent to when a conventional cBN sintered body tool for hardened steel cutting is used under higher speed conditions can be achieved, while preventing residual of tensile stress.

EFFECT OF THE INVENTION

In uses to cut hardened steel parts having a hardness of Hv 4.5 GPa or more by utilizing a cutting tool comprising a cBN sintered body of the present invention, the production of an affected layer by machining on the cutting surface of the machined part is suppressed and residual compression stress is promoted because cutting edge temperature and heat are suppressed during cutting, and therefore the fatigue life of the machined part is enhanced and the lifespan of the cutting tool is improved remarkably.

BEST MODE FOR CARRYING OUT THE INVENTION

As shown in FIG. 1, cBN sintered body cutting tool 10 of the present invention can greatly improve wear resistance, that is, tool lifespan, while preventing residual of tensile stress due to an increase of cutting edge temperature, which is a disadvantage of low thermal conductivity ceramics, by coating the outermost surface of the tool composed of the aforementioned high conductivity cBN sintered body 1 with heat resistant film 2, represented by TiAlN and CrAlN, etc., having a thickness of 0.5 μm to 12 μm.

The cBN sintered body cutting tool 10 of the present invention has a structure that the aforementioned cBN sintered body 1 is joined to substrate 3 comprising a carbide, a cermet, a ceramic or a ferrous material directly through brazed part 4, or through brazed part 4 and metal backing 13 made of a carbide sintered integrally with cBN sintered body 1.

Further, by using cBN sintered body cutting tool 10 of the present invention under conditions of not less than V=40 m/min and not more than 70 m/min, the equal lifetime to when using conventional cBN sintered body tools to cut hardened steel under high velocity conditions can be achieved, while preventing residual tensile stress even in hardened steel cutting applications that need a requisite precision of Rz 0.4 μm to 3.2 μm at a machine efficiency of a chip removal volume W per unit time of 1,200 mm³/min or more. Although cutting conditions of not less than V=40 m/min and not more than 70 m/min have the advantages of lowering cutting temperature and producing a less affected layer by machining, the cutting resistance is contrary high because the softening of the machined article during cutting is insufficient, and the lifespan of the tool is unavoidably shortened by the worsening of surface roughness and defects from the production of mechanical wear and chipping, which does not occur when used under high speed conditions exceeding V=100 m/min. Consequently, even if cutting is performed by use of a cBN sintered body cutting tool with a low cBN content ratio sintered body which was coated with the aforementioned heat resistant film and which comprised a ceramic binder of TiN or TiC, stable long lasting machining while maintaining satisfactory surface roughness in the same way as with the cBN sintered body cutting tool of the present invention is difficult, because the strength and toughness are lower than that of the cBN sintered body of the present invention.

Because of the previously described superior strength and toughness, cBN sintered body tools having a high cBN content ratio is expected to exhibit the higher performance, the higher the cBN content ratio in the cBN sintered body, as long as the heat resistant film of the present invention can coat with sufficient bonding strength. But actually, a cBN sintered body with a cBN content percentage exceeding 95% by volume is not desirable because the percentage of binder, which is an electric conductor, is too small with respect to the cBN particles, which are semiconductor and then the bonding strength with the heat resistant film formed by arc ion plating PVD is not sufficient to bear under cutting the workpiece after heat treatment.

The heat resistant film 2 of the present invention is preferable because, by making the Al content 0 to 10 at % with respect to the components of the film composition other than C, N, and O, it provides a thermal conductivity of 18 W/m·K or more and the cutting edge temperature lowers. Further, a coating film that is a TiAlVN composition with a V content of 0 to 10 at % and an Al content of 0 to 10 at % with respect to the components of the film composition other than C, N, and O is superior in lubrication characteristic, then is more preferable.

A coating film having TiAlMN (M=C, O, Si, V, etc.) composition and an M content of 12 to 20 at % and an Al content of 0 to 10 at % with respect to the components of the film composition other than C, N, and O has a thermal conductivity of not more than 50 W/m·K, because of prevention of the excessive influx of cutting heat to the tool cutting edge, it reduces the width of tool wear and improve the surface integrity of the machined surface.

As a more preferable form, assuming nose R, depth of cut d, feed rate f, side rake angle $\alpha b$ and inclination angle $\alpha s$ in the portion of the tool participating in cutting indicated in FIG. 2, a tool, in which a region of the aforementioned heat resistant film having an area of not less than 10% and not more than 80% with respect to the cutting cross-sectional area Q defined by $$Q=\{R^2 \cdot \tan^{-1}[f/\text{sqr}(4R^2-f^2)]+0.25f \cdot \text{sqr}(4R^2-f^2)+f(d-R)\}/(\cos \alpha s \cdot \cos \alpha b)$$

is removed, and also a tool in which the cBN sintered body directly contacts the workpiece to be cut during cutting, is superior in cutting edge heat releasability, and also suppresses the development of tool wear at the heat resistant film, and therefore can achieve longer lifetime with maintaining notably superior surface integrity from the initial cutting period.

Example 1

A commercial cBN powder with an average particle diameter of 2.5 μm and a binder powder were prepared. The binder powder was prepared by mixing 50% of Co, 40% of Al and 10% of WC by weight; and all powders of the Co, Al and WC had an average particle diameter of 1 μm.

As a result of assaying the components other than cBN by high frequency inductively conducted plasma emission analysis (ICP analysis), this cBN powder included 0.18% of oxygen and a total of 0.35% of Li, Si, Al, Ca, Mg, and carbon by weight percentage. The binder material powder and the cBN powder were mixed using a pot and ball made of carbide. This mixed powder was filled into a container made of carbide, sintered at a pressure of 7.2 GPa and a temperature of 2,050° C. for 60 minutes, and the various sintered bodies displayed in 11 to 25 of Table 1 were obtained. For each cBN sintered body composition, the product was identified by X-ray diffraction analysis, and the cBN content ratio was assayed by ICP analysis. The thermal conductivity of the cBN sintered bodies was measured by a xenon flash thermal conductivity meter.

Further, cutting was evaluated under the conditions below using tools having the respective cBN sintered bodies for the surface participating in cutting, and having a insert shape classified as ISO model No. CNGA120408.

For all of the inserts, the solid cBN sintered body material without carbide backing was brazed to a substrate made of carbide, cermet, ceramic, or a ferrous sintered material, then the cBN sintered body cutting face and the nose R part were processed by grinding, and subsequently, the aforementioned types of cutting edge preparation were machined. The thickness of the cBN sintered body and the carbide substrate after the aforementioned cutting edge preparation machining was 0.8 mm for all tools, and the brazed area of the cBN sintered body material bottom surface of the tools having a nose R of 2.4 R was 9.0 mm². The brazing part had a composition of Ag: 76 wt %, Cu: 21 wt %, Zr: 1 wt %, and Ti: 2 wt %; and the brazing was conducted at 850° C. For all samples, the thickness was 0.05 mm, and there were no vacancies in the brazing material.

For all inserts, after brazing the cBN sintered body on the respective insert substrates as previously described, the cBN sintered body cutting face and the nose R part were processed by grinding. Subsequently, further grinding was performed to process the cutting edges of all the aforementioned inserts into a chamfered shape with an angle of −25° and a width of 0.13 mm; when installing the insert in the holder, the inclination angle, the side rake angle, the back relief angle, the side relief angle, the end cutting angle, and the side cutting edge angle were −5°, −5°, 5°, 5°, 5° and −5°, respectively. Finally, after machining the aforementioned cutting edge shape, it was coated with various types of heat resistant films to a thickness of 0.2 to 15 μm by arc ion plating PVD.

Workpiece to be cut: JIS model No. SUJ2 outer diameter turning machining (DIN model No. 100Cr6), continuous machining Hardness of workpiece to be cut: HRc60
Cutting speed: V=40 m/min
Depth of cut: d=0.2 mm
Feed rate: f=0.18 mm/rev.
Cutting time: 100 min Coolant: Emulsion (manufacturing source: Japan Fluid System, product name: System Cut 96) 20 times diluted, 300 cc/min produced by mixing 50% of Co, 40% of Al and 10% of WC by weight as the starting material, and the starting material was sintered at a pressure of 5 GPa and a temperature of 1,500° C.

TABLE 1

| | cBN sintered body | | | | | Heat resistant film | | Affected layer |
|---|---|---|---|---|---|---|---|---|
| Smpl. No. *1 | cBN content volume % | cBN particle diameter μm | Binder composition | Thermal conductivity W/m·K | Substrate *2 | Composition *3 | Film thickness μm | Flank wear width VB μm *4 | thickness by machining μm *5 |
| 1 | — | — | Al$_2$O$_3$ | 20 | — | — | — | 250 | 38 |
| 2 | — | — | Al$_2$O$_3$ | 20 | Carbide | TiAlN | 3.0 | 240 | 37 |
| 3 | 60.0 | 2.5 | TiN, TiB$_2$, AlB$_2$, AlN, Al$_2$O$_3$ | 52 | Carbide | TiAlN | 3.0 | 84 | 19 |
| 4 | 60.0 | 2.5 | ↑ | 52 | Carbide | — | — | 200 | 25 |
| 5 | 65.0 | 2.5 | ↑ | 55 | Carbide | TiAlN | 3.0 | 88 | 17 |
| 6 | 85.0 | 2.5 | W$_2$Co$_{21}$B$_6$, Co$_3$W$_3$C, CoWB, WC | 80 | Carbide | TiAlN | 3.0 | 95 | 11 |
| 7 | 87.0 | 2.5 | ↑ | 80 | Carbide | TiAlN | 3.0 | 350 | 21 |
| 8 | 90.0 | 2.5 | ↑ | 85 | Carbide | TiAlN | 3.0 | 96 | 13 |
| 9 | 90.0 | 2.5 | ↑ | 85 | Carbide | — | — | 350 | 20 |
| 10 | 92.0 | 2.5 | ↑ | 90 | Carbide | TiAlN | 3.0 | 98 | 11 |
| 11 | 87.0 | 2.5 | ↑ | 100 | Carbide | TiAlN | 3.0 | 95 | 5 |
| 12 | 90.0 | 2.5 | ↑ | 120 | Carbide | TiAlN | 0.2 | 210 | 11 |
| 13 | 90.0 | 2.5 | ↑ | 120 | Carbide | TiAlN | 0.5 | 99 | 1.5 |
| 14 | 90.0 | 2.5 | ↑ | 120 | Carbide | TiAlN | 3.0 | 95 | 1.5 |
| 15 | 90.0 | 2.5 | ↑ | 120 | Carbide | TiAlN | 5.0 | 94 | 1.5 |
| 16 | 90.0 | 2.5 | ↑ | 120 | Carbide | TiAlN | 12.0 | 90 | 5 |
| 17 | 90.0 | 2.5 | ↑ | 120 | Carbide | TiAlN | 15.0 | 90 | 18 |
| 18 | 90.0 | 2.5 | ↑ | 120 | Carbide | TiN | 3.0 | 150 | 5 |
| 19 | 90.0 | 2.5 | ↑ | 120 | Carbide | CrAlN | 3.0 | 125 | 4 |
| 20 | 90.0 | 2.5 | ↑ | 120 | Carbide | TiCN | 3.0 | 120 | 5 |
| 21 | 90.0 | 2.5 | ↑ | 120 | Cermet | TiAlN | 3.0 | 95 | 1.5 |
| 22 | 90.0 | 2.5 | ↑ | 120 | Ceramic | TiAlN | 3.0 | 95 | 1.5 |
| 23 | 90.0 | 2.5 | ↑ | 120 | P/M | TiAlN | 3.0 | 95 | 1.5 |
| 24 | 95.2 | 2.5 | ↑ | 150 | Carbide | TiAlN | 3.0 | 99 | 0.8 |
| 25 | 99.0 | 2.5 | ↑ | 500 | Carbide | TiAlN | 3.0 | 115 | 0.2 |

*1

Sample 1 is a commercial TiC—Al$_2$O$_3$ (black ceramic) insert formed in a CNGA120416 shape for hardened steel finish cutting, and a piece processed in the same cutting edge preparation as the other samples was used.

For sample 2, TiC—Al$_2$O$_3$ (black ceramic) solid material whose size was the same as other cBN sintered body material was cut out with a wire cut from the commercial TiC—Al$_2$O$_3$ (black ceramic) insert of a CNMA120416 shape for hardened steel finish cutting, and, brazing to a carbide substrate, cutting edge preparation and TiAlN coating were performed in the same manner as the other samples, and cutting was evaluated.

Samples 3 to 5 are brazed cBN sintered body tools for commercial hardened steel finish cutting that took cBN powder and a mixed powder of binder material powders comprising TiN and Al as the starting material, and were sintered at a pressure of 5 GPa and a temperature of 1,500° C. for 60 minutes. The same cutting edge preparation as with the other samples was processed, and the samples except for sample 4 were coated with TiAlN, and then cutting was evaluated. The thickness of the cBN sintered body was the same as that of the other samples, and the cBN content ratio, particle diameter and composition, which were investigated by microstructure observations, XRD analysis and ICP analysis, are described in Table 1.

Samples 6 to 10 are brazed cBN sintered body tools for commercial cast iron cutting with cBN powder and a mixed binder powder with an average particle diameter of 1 μm for 60 minutes. The same cutting edge as the other samples was processed, and the samples except for sample 9 were coated with TiAlN, and then cutting was evaluated. The thickness of the cBN sintered body was the same as that of the other samples, and the cBN content ratio, particle diameter and composition, which were investigated by microstructure observations, XRD analysis and ICP analysis, are described in Table 1.

*2

The materials used for the substrate are represented. A carbide comprising a WC—8 wt % Co composition was used for the carbide; a cermet comprising TiC—5 wt % Ni—8 wt % Co was used for the cermet; a ceramic made of Si$_3$N$_4$ was used for the ceramic; and a ferrous sintered part equivalent to JIS SMF4045 was used for the P/M.

*3

The compositions of the materials used for the heat resistant film are represented. The TiAlN is a TiAlN with an atomic ratio of Al to Ti, Al/Ti, of 1; CrAlN is a CrAlN with Al/Cr=0.7; and TiCN is a TiCN with C/N=1.

*4

The measured values of the width of flank wear VB after 100 minutes of cutting time are represented.

*5

For the cross-section of the machined surface after 100 minutes of cutting time, the thickness of the affected layer by machining was measured after lapping and etching it with nital (ethanol+5 wt % nitric acid).

As indicated in Table 1, an affected layer thickness by machining of 37 μm or more was produced on sample Nos. 1 and 2, in which ceramic and a ceramic cutting edge were coated with heat resistant film, irrespective of the width of flank wear VB. Meanwhile, the affected layers produced with cBN cutting tools irrespective of heat resistant coated films were 22 μm or less in all cases.

Among the cBN sintered body cutting tools, samples 11, 13 to 16 and 18 to 25, which were of the present invention then had the superior thermal conductivity, the thickness of affected layer by machining produced was 5 μm or less. In particular, sample Nos. 13 to 16, 18 to 25, which had a thermal conductivity of 120 W/m·K or more, were able to achieve a machined surface having excellent surface integrity.

Sample 12 had a thermal conductivity of 100 W/m·K or more, but because the heat resistant film was thin at 0.2 μm, then, it provided little effect to improve the wear resistance of the cBN sintered body. The frictional heat between the machined surface and the flank wear part, which had developed up to VB=210 μm, produced an affected layer by machining of 11 μm, and this layer was thicker than those of the cBN sintered body cutting tools of the present invention.

Sample 17 had a thermal conductivity of 120 W/m·K or more, and greatly suppressed the amount of flank wear at VB=90 μm because the heat resistant film was thick at 15 μm, but conversely, the affected layer by machining was 18 μm, which was thicker than those of the cBN sintered body cutting tools of the present invention. It is understood for the reason that releasing the frictional heat from between the machined surface and the tool flank to the interior of the cBN sintered body was difficult because of the thick heat resistant film, which is inferior in thermal conductivity compared to cBN sintered body, and that the affected layer by machining was more easily produced because the cutting edge temperature more increased than with cBN sintered body cutting tools of the present invention.

Example 2

A commercial cBN powder with an average particle diameter of 3.5 μm and a binder material powder were prepared. The binder material powder was prepared by mixing 50% of Co, 40% of Al, and 10% of WC by weight; and all powders of the Co, Al and WC had an average particle diameter of 1 μm. As a result of assaying components other than cBN component by inductively conducted plasma emission analysis (ICP analysis), this cBN powder comprised 0.18% of oxygen and a total of 0.35% of Li, Si, Al, Ca, Mg, and carbon by weight The binder material powder and the cBN powder were mixed using a pot and ball made of carbide.

2 weight % melamine resin was added to this mixed powder; this was filled into various types of containers made of carbide, sintered at a pressure of 7.1 GPa and a temperature of 2,050° C. for 60 minutes; and a sintered body, which comprised 90% of cBN components by volume with the remainder binder materials of $W_2Co_{21}B_6$, $Co_3W_3C$, CoWB and WC, and which had a thermal conductivity of 125 W/m·K, was obtained.

As for the individual sintered body compositions, the products were identified by X-ray diffraction analysis, and the cBN content ratios were quantitatively assayed by ICP analysis. The thermal conductivity of carbide backing and brazing material were solely measured by a xenon flash thermal conductivity meter after removing other materials by grinding.

Cutting was evaluated under the conditions below using tools having the aforementioned cBN sintered body on the surface participating in cutting, and having a insert shape classified as ISO model No. CNGA120412.

For all of the inserts, the cBN sintered body material with a carbide backing was joined using various brazing materials to a substrate of carbide, then the cBN sintered body cutting face and the nose R part of the tool cutting edge part were processed by grinding, and subsequently, the aforementioned types of cutting edge preparation were machined. The thickness of the cBN sintered body and the carbide backing after the aforementioned cutting edge preparation machining was 0.8 mm for all inserts, and the brazed area of the cBN sintered body material bottom surface of the inserts having a nose R of 1.2 R was 2.9 mm². Various brazing material were used for the brazing part, and the brazing was conducted at 870° C. in a vacuum atmosphere. For all samples, the thickness of the brazing part in the brazing layer was 0.05 mm, and there were no vacancies in the brazing material.

For all inserts, after brazing the cBN sintered body on the individual types of insert substrate as previously described, the cBN sintered body cutting face and the nose R part were processed by grinding. Subsequently, further grinding was conducted to process the cutting edges of all the aforementioned inserts into a chamfered shape with an angle of −25° and a width of 0.13 mm; when installing the insert in the holder, the inclination angle, the side rake angle, the back relief angle, the side relief angle, the end cutting angle, and the side cutting edge angle were −5°, −5°, 5°, 5°, 5° and −5° respectively. Finally, after machining the aforementioned cutting edge shape, it was coated with a 1 μm thick of TiAlN heat resistant film having an atomic ratio of Al to Ti, Al/Ti, of 1 by arc ion plating PVD.

Workpiece to be cut: JIS model No. SUJ2 outer diameter turning machining (DIN model No. 100Cr6), continuous machining Hardness of workpiece to be cut: HRc62

Cutting speed: V=90 m/min

Depth of cut: d=0.2 mm

Feed rate: f=0.12 mm/rev.

Cutting time: 60 min

Coolant: Emulsion (manufacturing source: Japan Fluid System, product name: System Cut 96) 20 times diluted, 300 cc/min

TABLE 2

| | Metal backing made of carbide | | Brazing material | | Affected layer | | |
|---|---|---|---|---|---|---|---|
| Smpl. No. | Composition wt % | Thermal conductivity W/m·K | Composition wt % | Thermal conductivity W/m·K | Flank wear width VB μm *1 | thickness by machining μm *2 | Residual stress GPa *3 |
| 26 | WC: 95% Co: 5% | 100 | Ag: 70% Cu: 29% Ti: 1% | 220 | 90 | 2.5 | −3.7 |
| 27 | WC: 95% Co: 5% | 100 | Ag: 76% Cu: 21% Zr: 1% Ti: 2% | 150 | 92 | 2.5 | −4.5 |

TABLE 2-continued

| Smpl. No. | Metal backing made of carbide Composition wt % | Thermal conductivity W/m·K | Brazing material Composition wt % | Thermal conductivity W/m·K | Flank wear width VB μm *1 | Affected layer thickness by machining μm *2 | Residual stress GPa *3 |
|---|---|---|---|---|---|---|---|
| 28 | WC: 95% Co: 5% | 100 | Ag: 76% Cu: 17% Ti: 7% | 120 | 94 | 3.5 | −4.0 |
| 29 | WC: 95% Co: 5% | 100 | Ag: 44% Cu: 12% Zr: 22% Ti: 22% | 80 | 96 | 4.5 | −3.3 |
| 30 | WC: 95% Co: 5% | 100 | Cu: 46% Zr: 27% Ti: 27% | 70 | 100 | 10.0 | −2.3 |
| 31 | WC: 93% Co: 7% | 80 | Ag: 44% Cu: 12% Zr: 22% Ti: 22% | 80 | 99 | 5.0 | −3.5 |
| 32 | WC: 93% Co: 7% | 80 | Ag: 70% Cu: 29% Zr: 1% | 220 | 104 | 4.0 | −4.0 |
| 33 | WC: 80% TiC: 10% Co: 10% | 70 | ↑ | 220 | 108 | 9.0 | −2.5 |
| 34 | WC: 70% TiC: 20% Co: 10% | 40 | ↑ | 220 | 115 | 10.0 | −2.3 |

*1
The measured values of the width of flank wear VB after 30 minutes of cutting time are represented.

*2
After 60 minutes of cutting time, the thickness of the affected layer by machining was measured after lapping the cross-section of the machined surface and etching it with nital (ethanol+5 wt % nitric acid).

*3
After 60 minutes of cutting time, the residual stress of the machined surface was measured by the $\sin^2 \Psi$ method (iso-inclination method) using a microregion X-ray stress analyzer. The minus sign in the Table indicates that compression stress was added.

As shown by samples Nos. 26 to 30 in Table 2, among the cBN sintered body cutting tools of the present invention having a metal backing made of carbide of the same composition manufactured from cBN sintered body material of the same composition using various kinds of brazing materials, notably, the tools that used brazing material having a thermal conductivity of 80 W/m·K or more produced less affected layer by machining and had higher residual compression stress values.

As indicated by sample Nos. 32 and 33, among the cBN sintered body cutting tools of the present invention having a metal backing made of carbide of the differing compositions manufactured from cBN sintered body material using brazing material of the same composition, notably, the tool that used metal backing made of carbide having a thermal conductivity of 80 W/m·K or more produced less affected layer by machining and had higher residual compression stress values.

The reason is supposed to be that: because the heat generated during cutting is conveyed from the interior of the cBN sintered body of the present invention, which is superior in thermal conductivity, to the carbide backing and brazing material of the present invention, which superior in thermal conductivity, then, the heat generated during cutting does not flow into the machined surface and increase of the cutting edge temperature is suppressed.

Example 3

A commercial cBN powder with an average particle diameter of 3 μm and a binder material powder were prepared. The binder material powder was prepared by mixing 65% of Co, 25% of Al and 10% of WC by weight; and all powders of the Co, Al and WC had an average particle diameter of 1 μm. As a result of assaying components other than cBN component by inductively conducted plasma emission analysis (ICP analysis), this cBN powder contained 0.18% of oxygen and a total of 0.35% of Li, Si, Al, Ca, Mg, and carbon by weight percentage. These binder material powder and cBN powder were mixed using a pot and ball made of carbide.

The cBN sintered bodies shown in sample Nos. 35 to 47 of Table 3 were obtained by adding 1 wt % of ammonium hydroxide powder ($NH_4OH$) to the mixed powder, enclosing this in a Ti capsule, vacuum sealing the capsule in a container made of carbide, denitriding it at 3 to 3.5 GPa and a temperature of 1,200° C. to 1,600° C., and then sintering at a pressure of 6.7 GPa, a temperature of 1,900° C. for 120 minutes.

When conducting X-ray diffraction analysis on the sintered bodies, $W_2Co_{21}B_6$, $Co_3W_3C$, CoWB, WC except cBN were identified in every sample, and the sintered bodies having a thermal conductivity of 88 to 510 W/m·K were obtained as shown in Table 3.

For the mole ratio of B to N of the cBN component in this sintered body, a rectangular piece of the sintered body having 3 to 7 mm per side and a thickness of 0.3 to 0.5 mm was treated in a tightly sealed container at 120° C. or more and less than 150° C. for 48 hours with hydrofluoric nitric acid, in which 40 mL of a doubly diluted of nitric acid of a concentration of 60% or more and less than 65% was mixed with 10 mL of hydrofluoric acid with a concentration of 45% or more and less than 50%. The residue components as a result were assayed by the aforementioned ICP method. When conducting X-ray diffraction analysis on the residue, no $W_2Co_{21}B_6$, $Co_3W_3C$, CoWB, or WC was identified in the residue of any sample. The cBN content ratio was assayed by ICP analysis, and the thermal conductivity of the cBN sintered bodies was measured by a xenon flash thermal conductivity meter.

Feed rate: f=0.16 mm/rev.

Cutting time: 100 min

Coolant: Emulsion (manufacturing source: Japan Fluid System, product name: System Cut 96) 20 times diluted, 300 cc/min

TABLE 3

| Smpl. No. | Denitrifying conditions Pressure GPa | Temperature ° C. | cBN sintered body B to N mole ratio in cBN component | cBN content ratio Volume % | Thermal conductivity W/m · K | Affected layer Flank wear width VB μm *1 | thickness by machining μm *2 | Residual stress GPa *4 |
|---|---|---|---|---|---|---|---|---|
| 35 | None | None | 1.05 | 82.0 | 88 | 60 | 11.0 | −2.0 |
| 36 | None | None | 1.05 | 90.0 | 125 | 60 | 5.0 | −5.0 |
| 37 | 3.5 | 1,200 | 1.10 | 90.0 | 122 | 62 | 4.5 | −5.2 |
| 38 | 3.5 | 1,300 | 1.12 | 90.0 | 120 | 63 | 4.0 | −5.4 |
| 39 | 3.5 | 1,400 | 1.15 | 90.0 | 118 | 65 | 2.0 | −5.8 |
| 40 | 3.3 | 1,400 | 1.12 | 90.0 | 120 | 62 | 4.0 | −5.4 |
| 41 | 3.4 | 1,400 | 1.13 | 90.0 | 118 | 65 | 2.5 | −5.6 |
| 42 | 4.0 | 1,400 | 1.17 | 90.0 | 110 | 70 | 3.5 | −5.5 |
| 43 | 4.0 | 1,600 | 1.20 | 90.0 | 100 | 75 | 6.0 | −4.8 |
| 44 | 3.5 | 1,400 | 1.15 | 95.2 | 145 | 70 | 1.5 | −6.0 |
| 45 | 3.5 | 1,400 | 1.15 | 97.0 | 200 | 72 | 0.9 | −6.5 |
| 46 | 3.5 | 1,400 | 1.15 | 99.0 | 470 | 75 | 0.5 | −7.0 |
| 47 | 3.5 | 1,400 | 1.15 | 99.5 | 510 | 350 *3 | 12.0 | −2.0 |

Next, the sintered bodies obtained were used to prepare tools having an insert shape classified as ISO model No. CNGA120420, and having the differing cBN sintered bodies of the compositions indicated by sample Nos. 35 to 47 in Table 3 in the surface participating in the cutting.

For all of the inserts, the solid cBN sintered body material without carbide backing was brazed to a substrate made of carbide, then the cBN sintered body cutting face and the nose R part were processed by grinding, and subsequently, the aforementioned types of cutting edge preparation were machined. The thickness of the cBN sintered body after the aforementioned cutting edge preparation machining was 0.8 mm for all inserts, and the brazed area on the cBN sintered body material bottom surface of the inserts having a nose R of 2.0 R was 9.5 mm². The brazing material part had a composition of Ag: 76 wt %, Cu: 21 wt %, Zr: 1 wt %, and Ti: 2 wt %; and the brazing was conducted at 850° C. For all samples, the thickness of the brazing layer in the brazing material part was 0.05 mm, and there were no vacancies in the brazing material part.

For all inserts, after brazing the cBN sintered body on the various types of insert substrate as previously described, the cBN sintered body cutting face and the nose R part were processed by grinding. Subsequently, further grinding was conducted to process the cutting edges of all the aforementioned inserts into a chamfered shape with an angle of −25° and a width of 0.13 mm; when installing the insert in the holder, the inclination angle, the side rake angle, the back relief angle, the side relief angle, the end cutting angle, and the side cutting edge angle were −5°, −5°, 5°, 5°, 5° and −5°, respectively. Finally, after machining the aforementioned cutting edge shape, it was coated with a 1 μm thick TiAlN heat resistant film having an atomic ratio of Al to Ti, Al/Ti, of 1 by arc ion plating PVD.

Workpiece to be cut: JIS model No. FCD600 (DIN model No. GJS-600), continuous machining Hardness of workpiece to be cut: HB200

Cutting speed: V=100 m/min

Depth of cut: d=0.15 mm

*1

The measured values of the width of flank wear VB after 60 minutes of cutting time are represented.

*2

After 60 minutes of cutting time, the thickness of the affected layer by machining was measured after lapping the cross-section of the machined surface and etching it with nital (ethanol+5 wt % nitric acid).

*3

Only in sample 47, the width of flank wear VB reached 350 μm after 10 minutes of cutting time because the TiAlN heat resistant film peeled off. Then, cutting was discontinued and the thickness of the affected layer by machining and the residual stress were measured.

For the other samples, the width of flank wear VB was measured at 60 minutes of cutting time, and the thickness of the affected layer by machining and the residual stress were measured at that time.

*4

The residual stress of the machined surface after cutting was measured by the $\sin^2 \Psi$ method (iso-inclination method) using a microregion X-ray stress analyzer. The minus sign in the table indicates that compression stress was added.

As indicated in Table 3, the amount of affected layer by machining produced in sample Nos. 36 to 42 and 44 to 46, which were cBN sintered body cutting tools of the present invention, was suppressed to 6.0 μm or less in all samples. Sample Nos. 39, 41, and 44 to 46, in which the B/N ratios of the cBN particles forming the cBN sintered bodies were not less than 1.13 and not more than 1.15, suppressed the amount of affected layer by machining produced to 2.5 μm or less, and had high residual compression stress.

In sample Nos. 36 to 42, irrespective of a slight drop in thermal conductivity related to the increase of B to N ratio in the cBN component, high surface integrity were obtained. It is understood for the reason that $B_2O_3$ superior in lubrication characteristic was produced and the frictional heat decreased in the scraping region with the machined article because the stoichiometry of the B and N in the cBN composition deviated to a composition with a surplus of B.

Meanwhile, sample No. 43, in which the 1.20 mole ratio of B to N in the cBN composition exceeded 1.17, had decreased performance in the amount of affected layer by machining produced and in the residual stress characteristics. It is understood for the reason that the presence of an excessive B component not participating in the atomic bonding among the cBN lattice lowered the wear resistance, and the harmonic vibration of the cBN crystal lattice forming the cBN component was interrupted.

Sample No. 47 had extremely high thermal conductivity equal to the cBN sintered body cutting tools of the present invention. Consequently, high surface integrity would be obtainable when cutting hardened steel if it were possible to suppress the development of excess VB wear, which is a disadvantage of cBN sintered body cutting tools with a high cBN content ratio. Nonetheless, cBN sintered body in which the cBN content ratio exceeds 99% by volume showed a large amount of VB and could not obtain the high surface integrity like the present invention. This is because: a small percentage of binder material having electric conductivity with respect to the cBN particles having no electric conductivity; the bonding strength with the heat resistant film formed by arc ion plating PVD was not sufficient to hold up to cutting after sintering; then the heat resistant film peeled off in the early period of cutting.

Example 4

A commercial hBN and a melamine resin powder as starting materials and metal catalysts comprising MgBN and LiCaBN containing slight amounts of Al and Si were used to synthesize the high purity cBN powder with an average particle diameter of 0.7 to 7 μm, and a Li, Si, Mg, Al, Ca and carbon with respect to cBN composition of 0.05% or less by weight.

The amount of Li, Ca, Al, Si, and Mg mixed into the cBN composition was controlled by changing the added amounts of MgBN and LiCaBN metal catalysts containing slight amounts of Al and Si; and the amount of carbon mixed in was controlled by adjusting the preprocessing temperature of the aforementioned hBN starting material 1,100° C. to 1,500° C. in a hydrogen gas atmosphere using a high frequency furnace.

This binder material powder was made by mixing together 70 wt % of Co, 20 wt % of Al, and 10 wt % of WC. The high purity cBN powder and the binder material powder were mixed using a pot and a ball made of carbide.

The mixed powder was placed in a container made of carbide, and sintered at a pressure of 8.0 GPa and a temperature of 1,700° C. for 30 minutes. When analyzing the sintered bodies by X-ray diffraction, $W_2Co_{21}B_6$, $Co_3W_3C$, CoWB, and WC, etc. except for cBN were identified in every sample. As the results of ICP analysis of the cBN sintered bodies, the cBN content ratio was 90% by volume in all samples except sample No. 49.

The individual cBN sintered bodies are shown in Table 4. For the amount of oxygen and the amount of Li, Ca, Al, Si, Mg and carbon with respect to the cBN component in this sintered body, a rectangular piece of the sintered body 3 to 7 mm per side with a thickness of 0.3 to 0.5 mm was put in a tightly sealed container and treated at 120° C. or more and less than 150° C. for 48 hours with a hydrofluoric nitric acid, in which 40 mL of a doubly diluted nitric acid with a concentration of 60% or more and less than 65% was mixed with 10 mL of hydrofluoric acid with a concentration of 45% or more and less than 50%. The resulting residue components were assayed by the aforementioned ICP method. When conducting X-ray diffraction analysis on the residue, no $W_2Co_{21}B_6$, $Co_3W_3C$, CoWB, or WC was identified in any sample.

Next, the sintered bodies obtained, were made into tools having, in the surface participating in cutting, the cBN sintered bodies with the different compositions displayed as sample Nos. 48 to 62 in Table 4, and having a insert shape classified as ISO model No. CNGA120412.

For all of the inserts, the solid cBN sintered body material without carbide backing was brazed to a substrate made of carbide, then the cBN sintered body cutting face and the nose R part were processed by grinding, and subsequently, the aforementioned types of cutting edge preparation were machined. The thickness of the cBN sintered body after the aforementioned cutting edge preparation machining was 0.8 mm for all inserts, and the brazed area on the cBN sintered body material bottom surface of the inserts having a nose R of 1.6 R was 10.0 mm². The brazing had a composition of Ag: 76 wt %, Cu: 21 wt %, Zr: 1 wt %, and Ti: 2 wt %; and the brazing was conducted at 850° C. For all samples, the thickness of the brazing material part in the brazing layer was 0.05 mm, and there were no vacancies in the brazing material part.

For all inserts, after brazing the cBN sintered body on the various types of insert substrate as previously described, the cBN sintered body cutting face and the nose R part were processed by grinding. Subsequently, further grinding was conducted to process the cutting edges of all the aforementioned inserts into a chamfered shape with an angle of −25° and a width of 0.13 mm; when installing the insert in the holder, the inclination angle, the side rake angle, the back relief angle, the side relief angle, the end cutting angle, and the side cutting edge angle were −5°, −5°, 5°, 5°, 5° and −5°, respectively. Finally, after machining the aforementioned cutting edge shape, it was coated with a 1 μm thick heat resistant film having an atomic ratio of Al to Ti, Al/Ti, of 1 by arc ion plating PVD.

Workpiece to be cut: JIS model No. SUJ2 outer diameter turning machining (DIN model No. 100Cr6), continuous machining Hardness of workpiece to be cut: HRc63

Cutting speed: V=60 m/min

Depth of cut: d=0.25 mm

Feed rate: f=0.12 mm/rev.

Cutting time: 70 min

Coolant: Emulsion (manufacturing source: Japan Fluid System, product name: System Cut 96) 20 times diluted, 300 cc/min

TABLE 4

| Smpl. No. *1 | hBN preheat treatment °C. | Ratio of elements occupying in cBN component wt % | | | | cBN sintered body | | | | |
|---|---|---|---|---|---|---|---|---|---|---|
| | | Amount of oxygen | Carbon | Sum of Li, Mg, Si, Al, Ca | Sum of Li, Mg, Si, Al, Ca, carbon *2 | cBN particle diameter μm | Thermal conductivity W/m·K | Flank wear width VB *3 μm | Surface roughness Rz *4 μm | Affected layer thickness by machining *5 μm |
| 48 | — | 0.20 | 0.130 | 0.220 | 0.350 | 3.0 | 85 | 75 | 3.4 | 11.0 |
| 49 | — | 0.20 | 0.130 | 0.220 | 0.350 | 3.0 | 120 | 75 | 3.2 | 4.0 |
| 50 | None | 0.20 | 0.130 | 0.090 | 0.210 | 3.0 | 125 | 75 | 3.2 | 4.0 |
| 51 | 1,100 | 0.17 | 0.020 | 0.050 | 0.070 | 3.0 | 135 | 75 | 2.8 | 2.5 |
| 52 | 1,250 | 0.15 | 0.050 | 0.050 | 0.100 | 3.0 | 142 | 74 | 2.8 | 2.2 |
| 53 | 1,500 | 0.12 | 0.010 | 0.050 | 0.060 | 3.0 | 150 | 74 | 2.8 | 2.0 |
| 54 | 1,500 | 0.13 | 0.010 | 0.050 | 0.060 | 0.7 | 100 | 76 | 2.0 | 7.0 |
| 55 | 1,500 | 0.14 | 0.007 | 0.050 | 0.057 | 1.0 | 130 | 75 | 2.0 | 3.5 |
| 56 | 1,500 | 0.12 | 0.002 | 0.010 | 0.012 | 3.0 | 105 | 75 | 2.8 | 6.0 |
| 57 | 1,500 | 0.12 | 0.003 | 0.017 | 0.020 | 3.0 | 152 | 73 | 2.8 | 2.0 |
| 58 | 1,500 | 0.12 | 0.002 | 0.100 | 0.102 | 3.0 | 135 | 75 | 2.8 | 2.5 |
| 59 | 1,500 | 0.12 | 0.003 | 0.017 | 0.200 | 3.0 | 133 | 75 | 2.8 | 2.5 |
| 60 | 1,500 | 0.12 | 0.002 | 0.220 | 0.222 | 3.0 | 125 | 75 | 3.2 | 4.0 |
| 61 | 1,500 | 0.12 | 0.001 | 0.050 | 0.051 | 6.0 | 150 | 74 | 3.2 | 2.0 |
| 62 | 1,500 | 0.11 | 0.001 | 0.050 | 0.051 | 7.0 | 160 | 72 | 5.0 | 1.5 |

*1
Sample No. 48 is the commercial insert used in sample No. 8 in Example 1 whose starting material was a commercial cBN powder.

Sample No. 49 is the cBN sintered body of the present invention used in sample No. 14 in Example 1 taking commercial cBN powder material as the starting material.

Sample Nos. 50 to 62 are cBN sintered bodies of the present invention using a cBN powder synthesized from hBN powder.

*2
This represents the total weight of elements excluding carbon and oxygen, such as Li, Ca, Al, Si and Mg, which are encompassed in the cBN component in this sintered body, as the ratio in wt % occupying in the cBN component.

*3
The measured values of the width of flank wear VB after 70 minutes of cutting time are represented.

*4
The surface roughness Rz was the ten point average roughness as stipulated in JISB0601 and it was measured in the axial direction of the cut workpiece under the conditions of cut off 0.8 μm and standard length l=4 mm.

*5
After 70 minutes of cutting time, the thickness of affected layer by machining was measured after lapping the cross-section of the machined surface and etching it with nital (ethanol+5 wt % nitric acid).

As indicated in Table 4, in contrast to the amount of affected layer by machining produced in the conventional cBN sintered body of 11.0 μm, sample Nos. 49 to 62, which are cBN sintered body cutting tools of the present invention, was able to restrict the amount of affected layer by machining produced to 7.0 μm or less.

Sample Nos. 51 to 53, 55, 57 to 59 and 61, among samples of the present invention, comprised a high purity cBN component in which: the cBN average particle diameter constituting the cBN sintered body was not less than 1.0 μm and not more than 6.0 μm; the cBN composition included carbon, oxygen and at least 1 or more element selected from Li, Si, Al, Ca and Mg; the sum of the aforementioned Li, Si, Al, Ca, Mg, and carbon with respect to the cBN component was not less than 0.02% and not more than 0.2% by wt %; and an amount of oxygen with respect to the cBN component was 0.17% or less by wt %. Of these cBN sintered body cutting tools of the present invention, these had a superior thermal conductivity, and the thickness of affected layer by machining produced was suppressed to 3.5 μm or less. It is understood that this is because the phonon conductivity has been improved because the Li, Si, Al, Ca, Mg and carbon components in the cBN particles, which obstruct the harmonic vibration of the cBN crystal lattice, decreased.

Among the present invention, it is understood for the reason that because the aforementioned harmonic vibration was obstructed, thermal conductivity was lower in sample Nos. 48 to 50 and 60, in which the sum of the Li, Si, Al, Ca, Mg and carbon components in the cBN particles was in excess of 0.2.

Conversely, the thermal conductivity was lower in sample No. 56, in which the sum of the Li, Si, Al, Ca, Mg and carbon components in the cBN particles was less than 0.02. It is understood for the reason that defects forming thermal barriers were formed inside the cBN sintered body because the effect to increase the bonding strength among cBN particles disappears when there are too few Li, Si, Al, Ca, Mg, and carbon components.

The thermal conductivity of the sample No. 54 also lowered, and it is understood that this is because the cBN particle size was very fine and then the particle boundary surface area of the cBN particles, which forms a thermal barrier, increased.

Meanwhile, because the cBN particle diameter in sample No. 62 was large, it appears that the particle boundary area, which forms a thermal barrier, was reduced, thermal conductivity was improved, and the amount of affected layer by machining produced was small. However, the surface roughness was a poor Rz 5.0 μm in contrast to the other samples that achieved satisfactory surface roughness of Rz 3.2 μm or less. The observation of the cutting edge of inserts evaluated revealed that cBN particle dropout from the tool end cutting edge was observed in all samples, the marks left from these dropped out particles were transferred to the machined surface and the marks determine the surface roughness.

Example 5 cBN sintered body material having a carbide backing using sample 26 of Example 2 was joined to a carbide substrate at 700° C. to 1,000° C. in a vacuum atmosphere using 3 types of brazing material. And, shown in Table 5 are the individual cBN sintered body cutting tools with the same insert shape, cutting edge processing, and heat resistant film coating as in Example 2.

Sample Nos. 63 to 79 used a brazing material having a composition of Ag: 76%, Cu: 23%, and Ti: 1% by weight, or this brazing material in which cBN, diamond, WC, or W with an average particle diameter of 5 to 200μ was distributed. Sample No. 81 used a brazing material having a composition of Ag: 89%, Cu: 10%, and Ti: 1% by weight; and Sample No. 82 used a brazing material having a composition of Ag: 76%, Cu: 21%, Ti: 2%, and Zr: 1% by weight.

The thermal conductivity of brazing material part was solely measured by a xenon flash thermal conductivity meter after removing other materials by grinding.

After the aforementioned machining to process the cutting edge of the tool as in Example 2, it was coated with a 1 μm thick TiAlN heat resistant film having an atomic ratio of Al to Ti, Al/Ti, of 1 by arc ion plating PVD, and the production of affected layer by machining was examined under the same cutting conditions as in Example 2.

not less than 0.02 mm and not more than 0.2 mm, and contained no vacancies having a major diameter exceeding 0.5 mm within the brazing material part, produced little affected layer by machining and had a high residual compression stress value.

Further, the cBN sintered body cutting tools of the present invention of sample Nos. 71 to 74, and 78, which contained within the brazing material part 5% to 40% by volume of cBN or diamond particles having an average particle diameter of 5 to 150 μm or less, and which had a thermal conductivity of 280 W/m·K or more, produced less affected layer by machining and had a high residual compression stress value.

For sample No. 63, which was brazed at low temperature, it is understood that melting of the brazing material and wetting between the cBN sintered body material and the carbide substrate was insufficient, vacancies of 0.6 mm or more formed where brazing material did not penetrate, and therefore these vacancies became a heat barrier, and the thermal conductivity was greatly reduced.

Meanwhile, in sample No. 69, the brazing material was sufficiently melted, but the temperature was excessively high,

TABLE 5

| | Added material | | | Brazing material | | | | | | |
|---|---|---|---|---|---|---|---|---|---|---|
| Smpl. No. | Type of particle | Average particle diameter μm | Content ratio Volume % | Brazed temperature °C. | Thickness mm | Major diameter of vacancy mm | Thermal conductivity W/m·K | Flank wear width VB μm | Affected layer thickness by machining μm | Residual stress GPa |
| 63 | — | — | — | 700 | 0.30 | 0.6 | 80 | 90 | 2.5 | −3.7 |
| 64 | — | — | — | 750 | 0.20 | 0.5 | 150 | 89 | 2.1 | −3.9 |
| 65 | — | — | — | 800 | 0.10 | 0.3 | 240 | 87 | 1.8 | −4.2 |
| 66 | — | — | — | 850 | 0.05 | 0 | 250 | 87 | 1.5 | −4.3 |
| 67 | — | — | — | 900 | 0.03 | 0.4 | 230 | 87 | 1.8 | −4.2 |
| 68 | — | — | — | 950 | 0.02 | 0.5 | 220 | 87 | 1.9 | −4.1 |
| 69 | — | — | — | 1,000 | 0.02 | 0.8 | 80 | 91 | 2.5 | −3.7 |
| 70 | Dia | 2 | 40 | 850 | 0.04 | 0.4 | 260 | 87 | 1.8 | −4.5 |
| 71 | Dia | 5 | 40 | 850 | 0.06 | 0.3 | 300 | 86 | 1.0 | −5.0 |
| 72 | Dia | 20 | 5 | 850 | 0.10 | 0.3 | 280 | 87 | 1.1 | −4.9 |
| 73 | Dia | 20 | 15 | 850 | 0.10 | 0.3 | 300 | 86 | 1.0 | −5.0 |
| 74 | Dia | 20 | 40 | 850 | 0.10 | 0.3 | 320 | 86 | 0.9 | −5.2 |
| 75 | Dia | 20 | 50 | 850 | 0.10 | 0.7 | 100 | 90 | 2.3 | −3.8 |
| 76 | Dia | 150 | 40 | 850 | 0.20 | 0.7 | 100 | 90 | 2.3 | −3.8 |
| 77 | Dia | 200 | 40 | 850 | 0.25 | 0.6 | 80 | 90 | 2.6 | −3.7 |
| 78 | cBN | 20 | 40 | 850 | 0.10 | 0.1 | 350 | 85 | 0.8 | −6.0 |
| 79 | WC | 20 | 40 | 850 | 0.10 | 0.5 | 260 | 87 | 1.5 | −4.6 |
| 80 | W | 20 | 40 | 850 | 0.10 | 0.5 | 260 | 87 | 1.5 | −4.6 |
| 81 | — | — | — | 850 | 0.05 | 0 | 220 | 87 | 1.8 | −4.2 |
| 82 | — | — | — | 850 | 0.05 | 0 | 150 | 89 | 2.0 | −3.9 |

*1
The measured values of the width of flank wear VB after 60 minutes of cutting time are represented.

*2
After 60 minutes of cutting time, the thickness of the affected layer by machining was measured after lapping the cross-section of the machined surface and etching it with nital (ethanol+5 wt % nitric acid).

*3
After 60 minutes of cutting time, the residual stress of the machined surface was measured by the $\sin^2 \Psi$ method (iso-inclination method) using a microregion X-ray stress analyzer. The minus sign in the table indicates that compression stress was added.

The samples indicated by sample Nos. 63 to 82 are cBN sintered body cutting tools of the present invention, and in particular, as indicated in sample Nos. 65 to 68 and 81, tools comprising a brazing material part which had a thermal conductivity of 220 W/m·K or more, a brazing layer thickness of therefore it is understood that the viscosity of the melted brazing material was lowered, the brazing material flowed out from the surface boundary between the cBN sintered body material and the carbide substrate, and large vacancies of 0.8 mm were formed.

In sample Nos. 75 to 77, 79 and 80, hardened particles superior in thermal conductivity and Young's modulus were distributed in the brazing material part in order to reduce the cutting edge temperature of the cBN sintered body part during cutting, but if the particle diameter was too large or the amount added to the brazing material was too much, brazing material penetration is insufficient, to the contrary, vacant defects are generated and the surface characteristics of the machined surface are not improved.

It appears that the type of hardened particles affect the wettability with the brazing material, and the cBN particles, which have inferior thermal conductivity than diamond particles as a hard particle single body, had superior wettability with the brazing material. Sample No. 78, in which cBN particles were distributed in the brazing material, was notably superior.

Example 6

Tools having an insert shape classified by ISO model No. CNGA120408 and having the cBN sintered body material of the present invention used in sample 27 of Example 2 on the surface participating in cutting were prepared; and the cBN sintered body cutting tools finally coated with the various types of heat resistant films of 1 μm thickness shown in Table 6 by arc ion plating PVD were manufactured. Cutting was evaluated under the following conditions.

For all of the inserts, solid cBN sintered body material without a carbide backing was brazed to a substrate made of a carbide, then the cBN sintered body cutting face and the nose R part were processed by grinding, and subsequently, the aforementioned types of cutting edge preparation were machined. The thickness of the cBN sintered body after the aforementioned cutting edge preparation machining was 0.8 mm for all inserts, and the brazed area of the cBN sintered body material bottom surface of the inserts having a nose R of 0.8 R was 3.2 mm². Brazing was conducted at 850° C. using brazing material having a composition of Ag: 76 wt %, Cu: 21 wt %, Zr: 1 wt % and Ti: 2 wt %. For all samples, the thickness of brazing layer of the brazing material part was 0.05 mm, and there were no vacancies in the brazed material part.

For all inserts, after brazing the cBN sintered body on the various types of insert substrate as previously described, the cBN sintered body cutting face and the nose R part were processed by grinding. Subsequently, further grinding was conducted to process the cutting edges of all the aforementioned inserts into a chamfered shape with an angle of −25° and a width of 0.13 mm; when installing the insert in a holder, the inclination angle, the side rake angle, the back relief angle, the side relief angle, the end cutting angle, and the side cutting edge angle were −5°, −5°, 5°, 5°, 5° and −5°, respectively.

As to the thermal conductivity of the heat resistant film, the heat resistant film was formed on an SUS304 plate to a thickness of 15 μm, and the thermal conductivity was measured by a xenon flash thermal conductivity meter.

Workpiece to be cut: JIS model No. S55C outer diameter turning machining (DIN model No. C55), continuous machining Hardness of workpiece to be cut: HRc45

Cutting speed: V=120 m/min

Depth of cut: d=0.3 mm

Feed rate: f=0.12 mm/rev.

Cutting time: 100 min

Coolant: None

TABLE 6

| | | Heat resistant film | | | Flank wear width VB μm *1 | Crater wear depth KT μm *2 | Affected layer thickness by machining μm *3 |
|---|---|---|---|---|---|---|---|
| Smpl. No. | Composition | Atomic ratio of Ti, Cr, Zr, V, Al At % | Atomic ratio of C, N, O At % | Thermal conductivity W/m · K | | | |
| 83 | None | — | — | — | 190 | 70 | Chipped at 65 min |
| 84 | $Al_2O_3$ | — | — | 20 | 70 | 14 | 20.0 |
| 85 | TiCN | Ti: 100 | C:N = 50:50 | 25 | 70 | 16 | 10.0 |
| 86 | TiN | Ti: 100 | — | 29 | 100 | 20 | 11.0 |
| 87 | TiZrN | Ti:Zr = 90:10 | — | 30 | 95 | 20 | 8.0 |
| 88 | TiAlCN | Ti:Al = 50:50 | C:N = 50:50 | 25 | 70 | 20 | 12.0 |
| 89 | TiAlN | Ti:Al = 30:70 | — | 50 | 65 | 62 | Chipped at 75 min |
| 90 | TiAlN | Ti:Al = 50:50 | — | 47 | 62 | 55 | Chipped at 85 min |
| 91 | TiAlN | Ti:Al = 85:15 | — | 42 | 70 | 47 | 4.0 |
| 92 | TiAlN | Ti:Al = 90:10 | — | 40 | 77 | 38 | 4.0 |
| 93 | TiAlN | Ti:Al = 95:5 | — | 35 | 85 | 25 | 3.5 |
| 94 | TiAlVN | Ti:Al:V = 91:5:4 | — | 35 | 85 | 17 | 3.0 |
| 95 | TiAlVCNO | Ti:Al:V = 91:5:4 | C:N = 48:48:4 | 30 | 84 | 16 | 3.0 |
| 96 | TiAlVN | Ti:Al:V = 85:10:5 | — | 33 | 78 | 15 | 3.0 |
| 97 | TiAlVZrSiN | Ti:Al:V:Zr: = 88:5:2:4:1 | — | 32 | 84 | 13 | 2.5 |
| 98 | CrAlN | Cr:Al = 30:70 | — | 50 | 67 | 65 | Chipped at 74 min |
| 99 | CrAlN | Cr:Al = 50:50 | — | 47 | 77 | 60 | Chipped at 70 min |
| 100 | CrAlN | Cr:Al = 85:15 | — | 45 | 92 | 49 | 9.0 |
| 101 | CrAlN | Cr:Al = 95:5 | — | 40 | 100 | 45 | 8.0 |
| 102 | ZrAlN | Zr:Al = 95:5 | — | 35 | 85 | 32 | 4.0 |

*1

The measured values of the width of flank wear VB after 60 minutes of cutting time are represented.

*2

The measured values of the depth of crater wear KT after 60 minutes of cutting time are represented.

*3

After 100 minutes of cutting time, the thickness of the affected layer by machining was measured after lapping the cross-section of the machined surface and etching it with nital (ethanol+5 wt % nitric acid).

The samples indicated by sample Nos. 83 to 102 were cBN sintered body cutting tools of the present invention, but in particular, as indicated by sample Nos. 87, 91 to 97, and 100 to 102, cBN sintered body cutting tools of the present invention having a heat resistant film with a thermal conductivity of not less than 30 W/m·K and not more than 45 W/m·K produced small affected layer by machining of 9 μm or less, and exhibited a long lifetime.

The thermal conductivities of the heat resistant films of sample Nos. 83 to 86 and 88 were 29 W/m·K or less and the amount of affected layer by machining produced was 10.0 μm or more, because flowing the cutting heat produced on the machined surface into the cBN sintered body cutting tool of the present invention was interrupted.

Meanwhile, sample Nos. 89, 90, 98 and 99, which had a thermal conductivity of 47 W/m·K or more, resulted in chipping by the development of crater wear because the cutting heat produced at the machined surface flowed aggressively into the cBN sintered body cutting tool of the present invention.

Example 7

Tools having the insert shape classified by ISO model No. CNGA120408 and having the cBN sintered body material of the present invention used in sample 96 of Example 6 on the surface participating in cutting were prepared.

For all of the inserts, the solid cBN sintered body material without carbide backing was brazed to a substrate made of a carbide, then the cBN sintered body cutting face and the nose R part were processed by grinding, and subsequently, the aforementioned types of cutting edge preparation were machined. The thickness of the cBN sintered body after the aforementioned cutting edge preparation machining was 0.8 mm for all inserts, and the brazed area of the cBN sintered body material bottom surface of the inserts having a nose R of 0.8 R was 3.2 mm². The brazing part had a composition of Ag: 76 wt %, Cu: 21 wt %, Zr: 1 wt %, and Ti: 2 wt %; and the brazing was conducted at 850° C. For all samples, the thickness of brazing layer of the brazing material part was 0.05 mm, and there were no vacancies in the brazed material part.

For all inserts, after brazing the cBN sintered body on the various types of insert substrate as previously described, the cBN sintered body cutting face and the nose R part were processed by grinding. Subsequently, further grinding was conducted to process the cutting edges of all the aforementioned inserts into a chamfered shape with an angle of −25° and a width of 0.13 mm; when installing the insert in a holder, the inclination angle, the side rake angle, the back relief angle, the side relief angle, the end cutting angle, and the side cutting edge angle were −5°, −5°, 5°, 5°, 5° and −5°, respectively.

Next, in the same way as the cBN sintered body tool of the present invention of sample No. 96 in Example 6, after machining the aforementioned cutting edge shape, it was coated with a 1 μm thick TiAlVN heat resistant film with the percentages of Ti, Al, and V at 85 at %, 10 at % and 5 at %, respectively, by arc ion plating PVD.

Finally, 18 types of samples shown in Table 7 were manufactured by removing, in the part participating in cutting, a region of the heat resistant film having an area of not less than 10% and not more than 80% with respect to the cutting cross-sectional area Q defined by $$Q=\{R^2 \cdot \tan^{-1}[f/\mathrm{sqr}(4R^2-f^2)]+0.25f \cdot \mathrm{sqr}(4R^2-f^2)+f(d-R)\}/(\cos\alpha s \cdot \cos\alpha b),$$

with assuming nose R, depth of cut d, feed rate f, side rake angle αb, and inclination angle αs.

Cutting of these samples was evaluated using various types of coolants under the following conditions.

Workpiece to be cut: JIS model No. SCM420 outer diameter turning machining (DIN model No. 25CrMo4), continuous machining Hardness of workpiece to be cut: HRc58

Cutting speed: V=120 m/min

Depth of cut: d=0.2 mm

Feed rate: f=0.1 mm/rev.

Cutting time: 80 min (1) Coolant: Emulsion (manufacturing source: Japan Fluid System, product name: System Cut 96) 20 times diluted, 500 cc/min (2) Oil mist (manufacturing source: Fuji BC Engineering, product name: Bluebe LB-1)

TABLE 7

| Smpl. No. | Percentage of the area of heat resistant film removed to the cutting cross-sectional area Q | | Coolant | VB *1 μm | KT *2 μm | Affected layer thickness by machining *3 μm | Residual stress GPa |
| --- | --- | --- | --- | --- | --- | --- | --- |
| | Flank face | Rake face | | | | | |
| 103 | Not coated with heat resistant film | Not coated with heat resistant film | None | 220 | 75 | Chipped at 67 min | Chipped at 67 min |
| 104 | 0 | 0 | None | 85 | 18 | 6.0 | −5.2 |
| 105 | 10 | 0 | None | 87 | 18 | 4.0 | −5.7 |
| 106 | 20 | 0 | None | 90 | 18 | 3.0 | −6.2 |
| 107 | 40 | 0 | None | 100 | 18 | 2.5 | −6.4 |
| 108 | 80 | 0 | None | 115 | 18 | 1.5 | −6.7 |
| 109 | 100 | 0 | None | 125 | 18 | 6.0 | −5.2 |
| 110 | 0 | 10 | None | 85 | 22 | 4.0 | −5.7 |
| 111 | 0 | 20 | None | 84 | 33 | 3.0 | −6.2 |
| 112 | 0 | 40 | None | 84 | 40 | 3.0 | −6.2 |
| 113 | 0 | 80 | None | 84 | 42 | 3.0 | −6.2 |
| 114 | 0 | 100 | None | 84 | 75 | Chipped at 72 min | Chipped at 72 min |
| 115 | 40 | 40 | None | 100 | 40 | 2.5 | −6.7 |

TABLE 7-continued

| Smpl. No. | Percentage of the area of heat resistant film removed to the cutting cross-sectional area Q | | Coolant | VB *1 μm | KT *2 μm | Affected layer thickness by machining *3 μm | Residual stress GPa |
|---|---|---|---|---|---|---|---|
| | Flank face | Rake face | | | | | |
| 116 | 40 | 40 | Emulsion 20 times diluted | 100 | 37 | 3.0 | −6.2 |
| 117 | 40 | 40 | Mist 0.5 cc/hour | 100 | 40 | 2.0 | −6.7 |
| 118 | 40 | 40 | Mist 1 cc/hour | 100 | 39 | 1.4 | −6.8 |
| 119 | 40 | 40 | Mist 10 cc/hour | 98 | 38 | 1.1 | −6.9 |
| 120 | 40 | 40 | Mist 300 cc/hour | 97 | 38 | 0.6 | −7.2 |
| 121 | 40 | 40 | Mist 350 cc/hour | 97 | 38 | 2.5 | −6.6 |

*1
The measured values of the width of flank wear VB after minutes of cutting time are represented.

*2
The measured values of the depth of crater wear KT after minutes of cutting time are represented.

*3
After 80 minutes of cutting time, the thickness of the affected layer by machining was measured after lapping the cross-section of the machined surface and etching it with nital (ethanol+5 wt % nitric acid).

*4
After 80 minutes of cutting time, the residual stress of the machined surface was measured by the $\sin^2 \Psi$ method (iso-inclination method) using a microregion X-ray stress analyzer. The minus sign in the table indicates that compression stress was added.

The samples indicated by sample Nos. 103 to 121 were cBN sintered body cutting tools of the present invention. In particular, as indicated by sample Nos. 105 to 107, 110 to 113, and 115 to 121, in which an area of not less than 10% and not more than 80% of the heat resistant film in the tool flank or tool rake face with respect to the cutting cross-sectional area Q defined by $$Q=\{R^2 \cdot \tan^{-1}[f/\mathrm{sqr}(4R^2-f^2)]+0.25f \cdot \mathrm{sqr}(4R^2-f^2)+f(d-R)\}/(\cos \alpha s \cdot \cos \alpha b)$$

was removed, all produced less affected layer by machining and had a higher residual compression stress value than the cBN sintered body cutting tools of the present invention in which the heat resistant film was not removed. It is understood that this is because the cutting heat generated at the machined surface is effectively released as the machined surface directly scrapes against the cBN sintered body material of the present invention, which has greatly superior thermal conductivity than the heat resistant film.

Among the aforementioned cBN sintered body cutting tools of the invention with part of the heat resistant film removed, in particular, the cBN sintered body cutting tools of the invention with part of the heat resistant film removed from the flank face exhibited longer lifetime than the cBN sintered body cutting tools of the invention with part of the heat resistant film removed from the tool rake face.

The cBN sintered body cutting tools of this invention with heat resistant film removed from the rake face had a shorter lifespan until chipping than did the cBN sintered body cutting tools of the invention with heat resistant film removed from the relief face. It is understood that this is because the KT wear of the rake face, which differs from the planar wear of VB wear on the relief face, develops into crater shapes; chipping tends to occur because the wedge angle of the cutting edge part is reduced by the development of this KT wear; and the development of KT wear is accelerated by the removal of the heat resistant film from the rake face.

Example 8

Tools having the insert shape classified by ISO model No. CNGA120408 having the cBN sintered body material of the present invention used in sample 96 of Example 6 on the surface participating in cutting, and having a wiper cutting edge 12 of 0.5 mm on the end cutting part of the cBN sintered body 1 as shown in FIG. 3 were prepared.

For all of the inserts, cBN sintered body material with carbide backing was brazed to a substrate made of a carbide using various types of brazing material, then the cBN sintered body cutting face and the nose R part were processed by grinding, and subsequently, the aforementioned types of cutting edge preparation were machined. The thickness of the cBN sintered body and carbide backing after the aforementioned cutting edge preparation machining was 0.8 mm for all inserts, and the brazed area of the cBN sintered body material bottom surface of the inserts having a nose R of 0.8 R after processing the cutting edge preparation was 3.15 mm². The brazing part had a composition of Ag: 76 wt %, Cu: 21 wt %, Zr: 1 wt %, and Ti: 2 wt %; and the brazing was conducted at 850° C. For all samples, the thickness of the brazing layer of the brazing material part was 0.05 mm, and there were no vacancies in the brazed material part.

For all inserts, after brazing the cBN sintered body on the various types of insert substrate as previously described, the cBN sintered body cutting face and the nose R part were processed by grinding. Subsequently, further grinding was conducted to process the cutting edges of all the aforementioned inserts into a chamfered shape with an angle of −25° and a width of 0.13 mm; when installing the insert in a holder, the inclination angle, the side rake angle, the back relief angle, the side relief angle, the end cutting angle, and the side cutting edge angle were −5°, −5°, 5°, 5°, 5° and −5°, respectively.

Finally, after machining the aforementioned cutting edge preparation, in the same way as the cBN sintered body tool of the present invention in sample No. 96 of Example 6, it was coated with a 1 μm thick TiAlVN heat resistant film with the percentages of Ti, Al, and V at 85 at %, 10 at % and 5 at %, respectively, by arc ion plating PVD. Cutting was evaluated under the various types of cutting speeds, feed rates, depth of cut conditions, and coolant discharge conditions displayed in Table 8.

The cutting speed, amount of feed, and depth of cut were predetermined so that all the cutting conditions would have the same machining efficiency.

For comparison, a binder material powder comprising 15% Al by weight with respect to TiN and commercial cBN powder with an average particle diameter of 3.5 μm were prepared. This binder material powder was placed in a carbide container, and was sintered for 60 minutes at a pressure of 8.5 GPa and a temperature 2,100° C. The obtained cBN sintered body was that: the cBN content ratio was 72% by volume; the TiN is characterized in that a mole ratio of Ti to N was 1.4; oxygen comprised 0.18% by weight percentage, and the total of the Li, Si, Al, Ca, Mg and carbon in the cBN component was 0.35%; and the cBN sintered body had a thermal conductivity of 72 W/m·K. The inserts of the cBN sintered bodies which had the same shapes and the same coating as sample Nos. 122 to 138 were prepared as the sample Nos. 139 to 142. When conducting X-ray diffraction analysis on these sintered bodies of sample Nos. 139 to 142, TiN, $TiB_2$, AlN, and $Al_2O_3$ etc. were identified in all samples except for the cBN. The cBN content ratio was quantified by ICP analysis, and the thermal conductivity of the cBN sintered body was measured using a xenon flash thermal conductivity meter. For the oxygen content, and the Li, Ca, Al, Si, Mg and carbon content with respect to the cBN component in this cBN sintered body, a rectangular piece of the sintered body 3 to 7 mm per side with a thickness of 0.3 to 0.5 mm was treated in a tightly sealed container at 120° C. or more and less than 150° C. for 48 hours in hydrofluoric nitric acid, in which 40 mL of a doubly diluted nitric acid with a concentration of 60% or more and less than 65% was mixed with 10 mL of hydrofluoric acid with a concentration of 45% or more and less than 50%. The resulting residue components were assayed by the aforementioned ICP method. When conducting X-ray diffraction analysis on this residue, no TiN, $TiB_2$, AlN, or $Al_2O_3$ was identified in the residue of any sample.

Workpiece to be cut: JIS model No. SUJ2 outer diameter turning machining (DIN model No. 100Cr6), continuous machining Hardness of workpiece to be cut: HRc60

Cutting time: 60 min

Chip removal volume: 134,400 $mm^3$ (Machining efficiency 2,240 $mm^3$/min)

Coolant: (1) Emulsion (manufacturing source: Japan Fluid System, product name: System Cut 96) 20 times diluted, 500 cc/min (2) Oil mist (manufacturing source: Fuji BC Engineering, product name: Bluebe LB-1)

TABLE 8

| Smpl. No. | Cutting conditions | | | | Flank wear width VB *1 | Affected layer thickness by machining *2 μm | Residual pressure *3 GPa |
|---|---|---|---|---|---|---|---|
| | Cutting speed V m/min | Feed rate F mm/rev. | Depth of cut d mm | Coolant | | | |
| 122 | 140 | 0.080 | 0.2 | Mist: 30 cc/hr | 120 | 5.0 | −5.0 |
| 123 | 112 | 0.160 | 0.1 | Mist: 30 cc/hr | 88 | 1.8 | −6.5 |
| 124 | 112 | 0.160 | 0.05 | Mist: 30 cc/hr | 99 | 2.0 | −6.3 |
| 125 | 112 | 0.160 | 0.02 | Mist: 30 cc/hr | 150 | 6.0 | −4.5 |
| 126 | 112 | 0.100 | 0.2 | None | 95 | 3.0 | −5.8 |
| 127 | 112 | 0.100 | 0.2 | Emulsion: 20 times diluted | 70 | 2.2 | −6.0 |
| 128 | 112 | 0.100 | 0.2 | Mist: 0.5 cc/hr | 140 | 3.0 | −5.8 |
| 129 | 112 | 0.100 | 0.2 | Mist: 1 cc/hr | 95 | 1.9 | −6.4 |
| 130 | 112 | 0.100 | 0.2 | Mist: 30 cc/hr | 90 | 1.7 | −6.5 |
| 131 | 112 | 0.100 | 0.2 | Mist: 300 cc/hr | 77 | 1.6 | −6.6 |
| 132 | 112 | 0.100 | 0.2 | Mist: 500 cc/hr | 75 | 2.2 | −6.0 |
| 133 | 100 | 0.112 | 0.2 | Mist: 30 cc/hr | 70 | 1.2 | −6.8 |
| 134 | 70 | 0.160 | 0.2 | Mist: 30 cc/hr | 48 | 0.8 | −7.0 |
| 135 | 70 | 0.160 | 0.2 | None | 55 | 2.0 | −6.2 |
| 136 | 50 | 0.224 | 0.2 | Mist: 30 cc/hr | 40 | 0.7 | −7.2 |
| 137 | 40 | 0.280 | 0.2 | Mist: 30 cc/hr | 38 | 0.5 | −7.5 |
| 138 | 20 | 0.280 | 0.4 | Mist: 30 cc/hr | 150 | 5.0 | −4.5 |
| 139 | 112 | 0.100 | 0.2 | None | 85 | 5.0 | −4.5 |

TABLE 8-continued

| Smpl. No. | Cutting conditions | | | | Flank wear width VB *1 | Affected layer thickness by machining *2 μm | Residual pressure *3 GPa |
| --- | --- | --- | --- | --- | --- | --- | --- |
| | Cutting speed V m/min | Feed rate F mm/rev. | Depth of cut d mm | Coolant | | | |
| 140 | 70 | 0.160 | 0.2 | None | Chipped at 50 min | | |
| 141 | 70 | 0.160 | 0.2 | Mist: 30 cc/hr | Chipped at 55 min | | |
| 142 | 40 | 0.280 | 0.2 | Mist: 30 cc/hr | Chipped at 12 min | | |

*1
The measured values of the width of flank wear VB after minutes of cutting time are represented.

*2
After 60 minutes of cutting time, the thickness of the affected layer by machining was measured after lapping the cross-section of the machined surface and etching it with nital (ethanol+5 wt % nitric acid).

*3
After 60 minutes of cutting time, the residual stress of the machined surface was measured by the $\sin^2 \Psi$ method (iso-inclination method) using a microregion X-ray stress analyzer. The minus sign in the table indicates that compression stress was added.

Sample Nos. 122 to 138 are all cBN sintered body cutting tools of the present invention, and achieved even more superior surface integrity when cutting hardened steel not by a dry cutting system without coolant but by changing to water-soluble coolant and oil mist, and by using under the conditions of a cutting speed V of not less than 40 m/min and not more than 70 m/min, a depth of cut of not less than 0.05 mm and not more than 0.3 mm, a feed rate f of not less than 0.16 mm/rev. and not more than 0.2 mm/rev.

Sample Nos. 126 to 132 μl used the same cutting conditions except for the coolant supply method, and sample 127, which used water-soluble coolant, produced less affected layer by machining and added higher residual compression stress than did sample 126, which did not use a coolant. Even though the width of flank wear VB were nearly the same as that of sample 126, which did not use a coolant, samples 129 to 131, in which oil mist discharge rate was 1 cc to 300 cc/hour, produced less affected layer by machining, added higher residual compression stress, and were preferable.

It is understood that this is because the oil mist penetrated into the boundary surface between the tool and the machined article by discharging a suitable amount of oil mist and the generation of heat during cutting was suppressed by lowering the friction.

Meanwhile, the same degree of effect to improve surface integrity as observed in samples 129 to 131 was not observed in sample 128, in which an oil mist discharge rate was less than 1 cc/hour, and in samples 132, which rate was in excess of 300 cc/hour. It is understood for the reason that if the discharge rate is too small, the lubricating effect of the oil mist can not function, and if too great, the oil mist has difficulty in penetrating to the surface boundary between the tool and machined article because of coagulation of the oil mist particles.

As indicated in sample Nos. 122 to 125, 130, 133, 134, and 136 to 138, the amounts of affected layer by machining produced and the residual stress values differed even at the same oil mist discharge rate. It is understood that this is because the amount of wear was suppressed by reducing the scraping distance of the tool and cutting material while suppressing the cutting edge temperature during cutting based on low-speed, small depth of cut, high feed conditions such that a cutting speed V was not less than 40 m/min and not more than 70 m/min, depth of cut was not less than 0.05 and not more than 0.3 mm, feed rate f was not less than 0.16 mm/rev. and not more than 0.2 mm/rev.

Meanwhile, wear contrary developed in the cBN sintered body of the present invention of sample No. 138, for which a cutting speed was less than V=40 m/min, and it is understood that this is because the cutting temperature was reduced too much, softening of the machined article by the cutting heat was insufficient, thus the cutting resistance was high.

As to the cBN sintered body of the present invention of sample No. 125, for which a depth of cut was less than 0.05 mm, it is understood that the same level of high surface integrity as in sample Nos. 137 and 124 could not be obtained, because the amount of wear grew by increasing the scraping distance, and because the heat of friction increased between the tool and the machined article.

The cBN sintered bodies of sample Nos. 139 to 142 were high thermal conductive sintered bodies with a main binder material of TiN, which differed from the cBN sintered body of the present invention. Although the wear resistance was high, defect prevention in the low speed region was lacked, and the lifespan was shorter than that of the cBN sintered body of the present invention.

Figure 1:
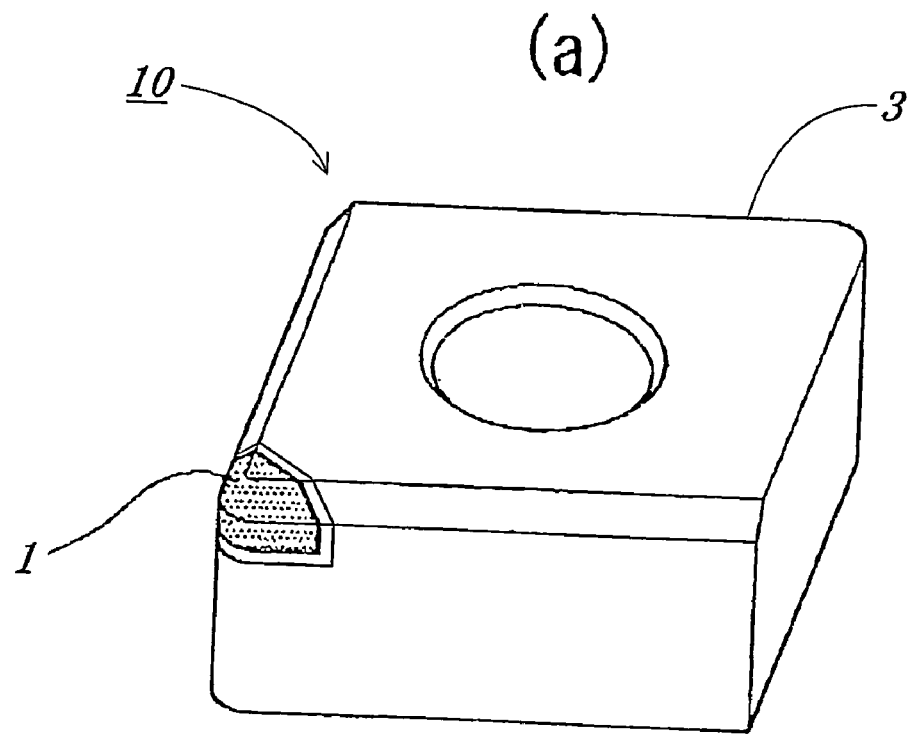
FIG. 1 This is a drawing showing an example of a cBN sintered body cutting tool according to the present invention. (a) is a perspective view, and (b) is an enlarged view of part of the cBN sintered body.
Figure 1:
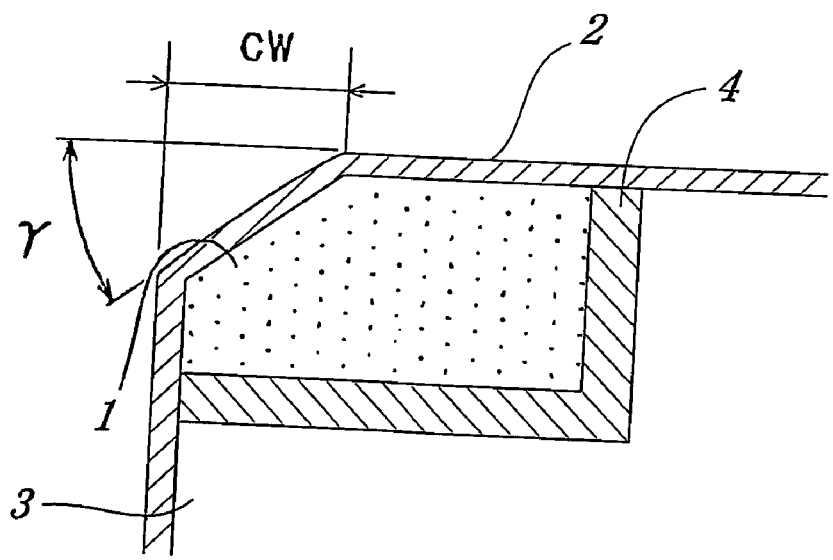
Figure 2:
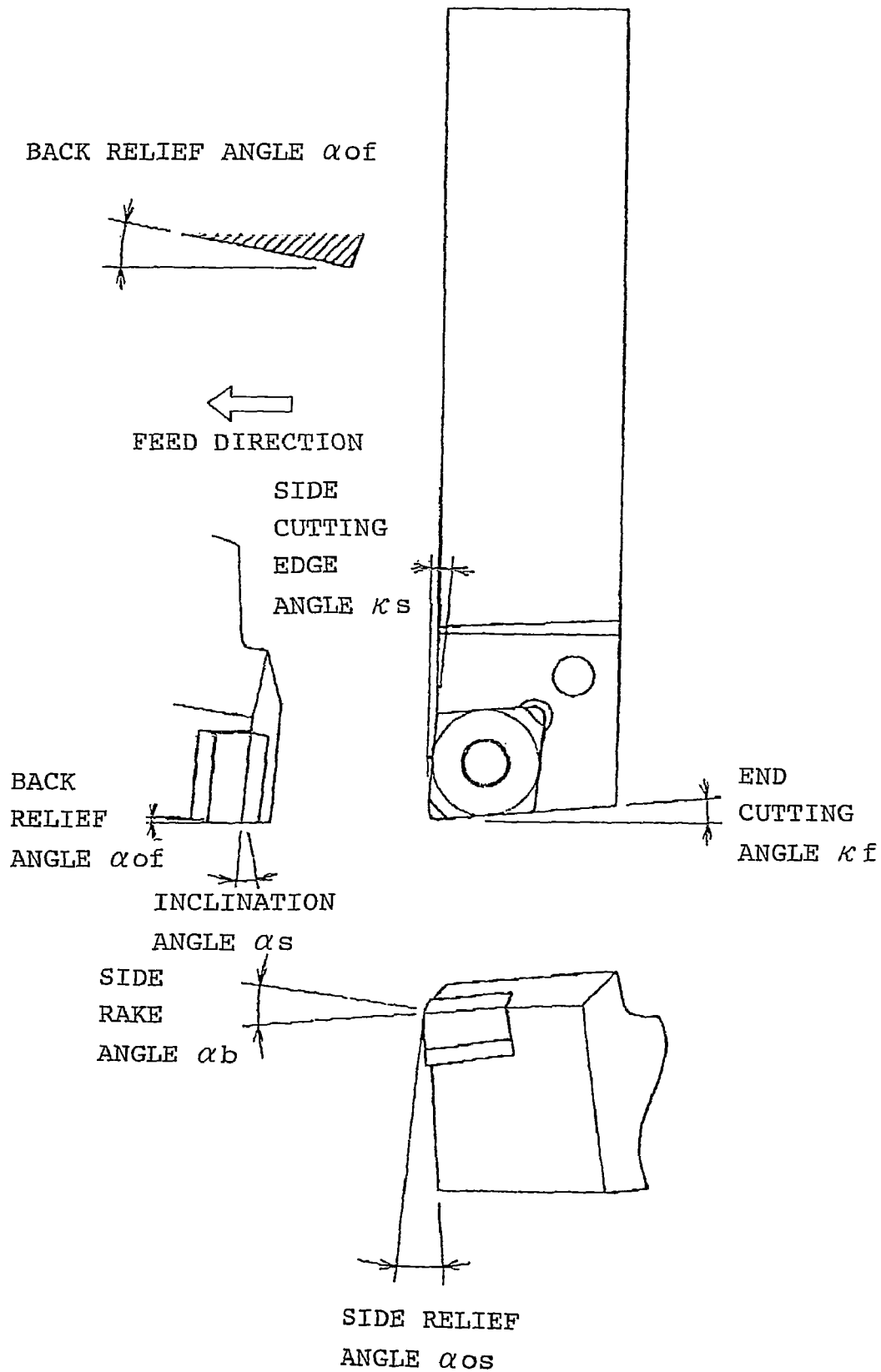
FIG. 2 This is a diagram to explain the portions related to cutting of a cBN sintered body cutting tool according to the present invention.
Figure 3:
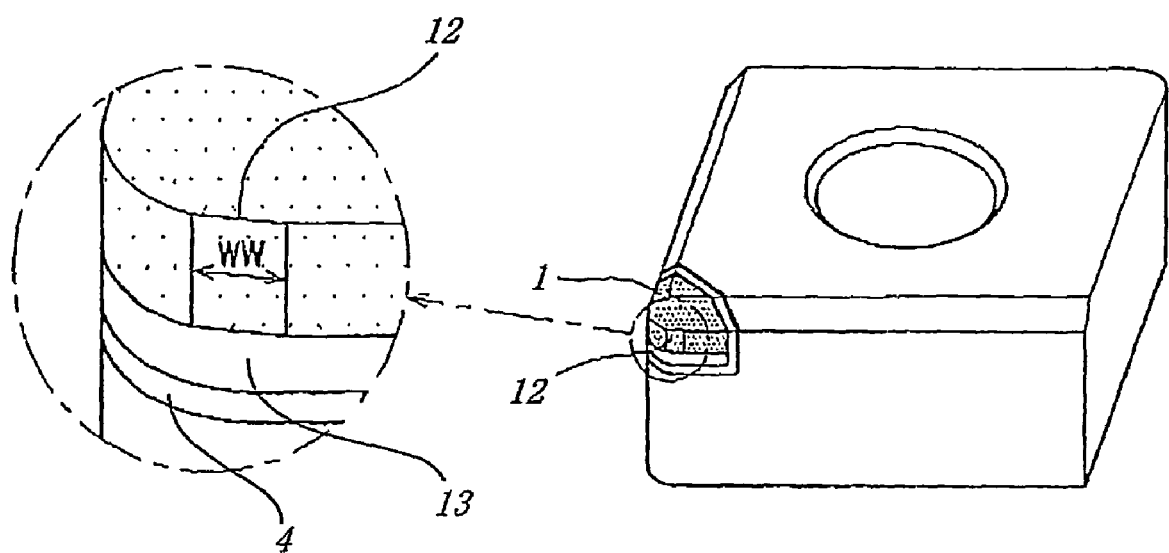
FIG. 3 This is a diagram of a cBN sintered body cutting tool according to the present invention, and explains one example of a cBN sintered body having a wiper cutting edge.

DESCRIPTION OF THE NUMERALS 1 cBN sintered body
2 Heat resistant film
3 Substrate
4 Brazing material part
10 cBN sintered body cutting tool
12 Wiper cutting edge
13 Metal backing

The invention claimed is:
1. A cBN sintered body for high surface integrity machining, having a cBN component of not less than 87% and not more than 99% by volume % and a thermal conductivity of 100 W/m·K or more, and an outermost surface of the cBN sintered body being coated with a heat resistant film having a thickness of 0.5 to 12 μm and comprising a compound of at least one element selected from 4a, 5a, 6a group elements and Al, and at least one element selected from C, N and O, wherein said cBN sintered body has a B to N mole ratio of not less than 1.10 and not more than 1.17 in the cBN component constituting said cBN sintered body, and, further includes carbon and at least one selected from a Co compound, an Al compound, a W compound or an oxygen compound as a binder material.

2. The cBN sintered body for high surface integrity machining according to claim 1, wherein an average particle diameter of the cBN particles constituting said cBN sintered body is not less than 1.0 μm and not more than 6.0 μm; the cBN component contains carbon, oxygen and at least one element selected from Li, Si, Al, Ca and Mg; a sum of said Li, Si, Al, Ca, Mg and carbon is not less than 0.02% and not more than 0.20% by wt % with respect to said cBN component; the cBN component comprises a highly pure cBN component with an amount of oxygen with respect to the cBN component of not more than 0.17% by wt %; and the cBN sintered body has a thermal conductivity of not less than 130 W/m·K.

3. A cBN sintered body for high surface integrity machining according to claim 1, wherein said heat resistant film has a thermal conductivity of not less than 30 W/m·K and not more than 45 W/m·K.

4. A cBN sintered body cutting tool, wherein the cBN sintered body according to claim 1 is brazed to a substrate comprising a carbide, a cermet, a ceramic or a ferrous material either directly or through a metal backing comprising a carbide sintered integrally with the cBN sintered body; and said metal backing and the brazing material part have a thermal conductivity of not less than 80 W/m·K.

5. The cBN sintered body cutting tool according to claim 4, wherein said brazing material part comprises at least one selected from Ti and Zr and at least one selected from Ag, Cu, Au and Ni, and has a thermal conductivity of not less than 220 W/m·K; a thickness of said brazing material part is not less than 0.02 mm and not more than 0.20 mm; and no vacancies having a major diameter exceeding 0.5 mm are contained in the brazing material part.

6. The cBN sintered body cutting tool according to claim 4, wherein said brazing material part contains 5% to 40% by volume of cBN particles or diamond particles with an average particle diameter of not less than 5 and not more than 150 μm; and the brazing material part has a thermal conductivity of not less than 280 W/m·K.

7. The cBN sintered body cutting tool according to claim 4, wherein, said heat resistant film of a region having an area of not less than 10% and not more than 80% with respect to a cutting cross-sectional area Q defined by $Q=\{R^2 \cdot \tan^{-1}[f/\mathrm{sqr}(4R^2-f^2)]+0.25f \cdot \mathrm{sqr}(4R^2-f^2)+f(d-R)\}/(\cos \alpha s \cdot \cos \alpha b)$, with assuming nose R, depth of cut d, feed rate f, side rake angle αb, and inclination angle αs, is removed in a portion of said cBN sintered body cutting tool participating in cutting, and the cBN sintered body directly contacts a workpiece to be cut during cutting.

8. The cBN sintered body cutting tool according to claim 7, wherein the heat resistant film of the region having the area of not less than 10% and not more than 80% with respect to said cutting cross-sectional area Q defined in claim 8 is removed from a tool flank of said cBN sintered body cutting tool in the region participating in cutting, and the cBN sintered body directly contacts a workpiece to be cut during cutting.

9. A cutting method for processing a workpiece to be cut to have high surface integrity, wherein the cBN sintered body cutting tool according to claim 4 is used to continuously cut a hardened steel of HRc 45 or more while spraying a water soluble cutting fluid at 300 cc/min or more over a cutting edge under conditions of a cutting speed V of not less than 40 m/min and not more than 70 m/min, a depth of cut of not less than 0.05 mm and not more than 0.30 mm, and an amount of feed rate f of not less than 0.16 mm/rev. and not more than 0.20 mm/rev.

10. A cutting method for processing a workpiece to be cut to have high surface integrity, wherein the cBN sintered body cutting tool according to claim 4 is used to continuously cut a hardened steel of HRc 45 or more while spraying an oil mist at not less than 1 cc/hour and less than 300 cc/hour over a cutting edge under conditions of a cutting speed V of not less than 40 m/min and not more than 70 m/min, a depth of cut of not less than 0.05 mm and not more than 0.30 mm, and an amount of feed rate f of not less than 0.16 mm/rev. and not more than 0.20 mm/rev.

* * * * *